US012681695B2

(12) United States Patent
Wang et al.

(10) Patent No.: US 12,681,695 B2
(45) Date of Patent: Jul. 14, 2026

(54) WEIGHT STATIONARY IN-MEMORY-COMPUTING NEURAL NETWORK ACCELERATOR WITH LOCALIZED DATA MULTIPLEXING

(71) Applicant: Intel Corporation, Santa Clara, CA (US)

(72) Inventors: Hechen Wang, Portland, OR (US); Renzhi Liu, Portland, OR (US); Richard Dorrance, Hillsboro, OR (US); Deepak Dasalukunte, Beaverton, OR (US); Shigeki Tomishima, Portland, OR (US)

(73) Assignee: Intel Products IP LLC, Santa Clara, CA (US)

( * ) Notice: Subject to any disclaimer, the term of this patent is extended or adjusted under 35 U.S.C. 154(b) by 0 days.

(21) Appl. No.: 17/855,097

(22) Filed: Jun. 30, 2022

(65) Prior Publication Data

US 2022/0334801 A1 Oct. 20, 2022

Related U.S. Application Data

(60) Provisional application No. 63/351,021, filed on Jun. 10, 2022.

(51) Int. Cl.
*G06F 7/544* (2006.01)
*G11C 11/419* (2006.01)

(52) U.S. Cl.
CPC .... *G06F 7/5443* (2013.01); *G06F 2207/4824* (2013.01); *G11C 11/419* (2013.01); *Y02D 10/00* (2018.01)

(58) Field of Classification Search
CPC ................................................... G06F 7/5443
See application file for complete search history.

(56) References Cited

U.S. PATENT DOCUMENTS

| | | | | |
|---|---|---|---|---|
| 12,487,795 B2 * | 12/2025 | Yang | ...................... | G06F 7/5443 |
| 2017/0294222 A1 * | 10/2017 | Savanth | .................. | G11C 5/063 |
| 2019/0042160 A1 * | 2/2019 | Kumar | .................. | G06F 3/0659 |
| 2019/0042199 A1 * | 2/2019 | Sumbul | .................... | G11C 8/10 |
| 2021/0034947 A1 * | 2/2021 | Wang | ........................ | G06F 1/12 |

* cited by examiner

*Primary Examiner* — Andrew Caldwell
*Assistant Examiner* — Carlos Heberto De La Garza
(74) *Attorney, Agent, or Firm* — Akona IP PC

(57) ABSTRACT

Systems, apparatuses, and methods include technology that identifies that a first memory cell of a plurality of memory cells stores data that is associated with a multiply-accumulate operation. The plurality of memory cells is associated with a multiply-accumulator (MAC). The technology executes a connection operation to electrically connect the first memory cell to the MAC to execute the multiply-accumulate operation. A second memory cell of the plurality of memory cells is electrically disconnected from the MAC during the multiply-accumulate operation. The technology executes, with the MAC, the multiply-accumulate operation based on the data.

25 Claims, 14 Drawing Sheets

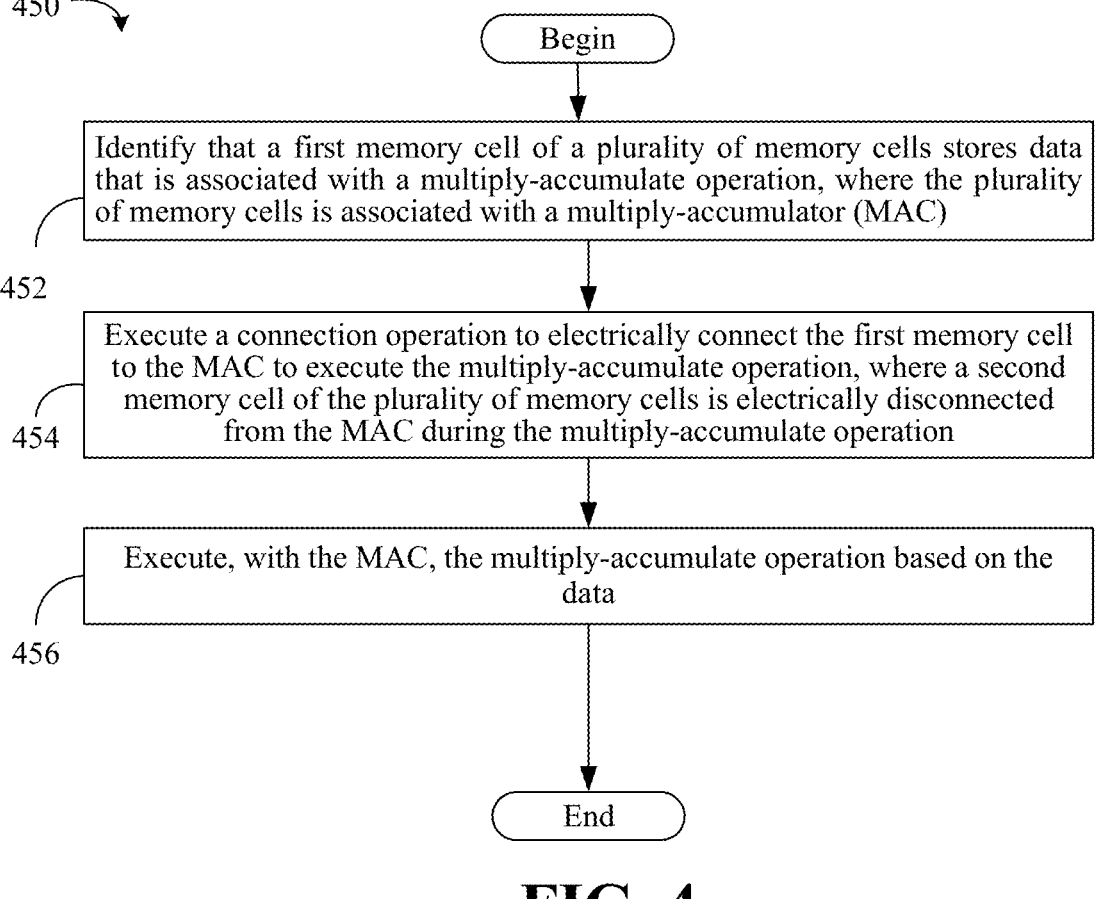

450

Begin

Identify that a first memory cell of a plurality of memory cells stores data that is associated with a multiply-accumulate operation, where the plurality of memory cells is associated with a multiply-accumulator (MAC)

452

Execute a connection operation to electrically connect the first memory cell to the MAC to execute the multiply-accumulate operation, where a second memory cell of the plurality of memory cells is electrically disconnected from the MAC during the multiply-accumulate operation

454

Execute, with the MAC, the multiply-accumulate operation based on the data

456

End

WEIGHT STATIONARY IN-MEMORY-COMPUTING NEURAL NETWORK ACCELERATOR WITH LOCALIZED DATA MULTIPLEXING

CROSS-REFERENCE TO RELATED APPLICATION

The present application claims the benefit of priority to U.S. Provisional Patent Application 63/351,021, filed on Jun. 10, 2022.

TECHNICAL FIELD

Embodiments generally relate to a Compute-in-Memory (CiM) architecture that includes one or more connection elements (e.g., switches or transistors) to facilitate electrical connections between memory cells and a multiply-accumulator. More particularly, embodiments relate to a CiM architecture that includes a plurality of memory banks that are selectively connected to a same multiply-accumulator to execute operations.

BACKGROUND

The computing capability and energy efficiency of modern computers (e.g., von Neumann architectures) are hindered by data movement between memory components and processing units. Such a situation is referred to as the memory wall problem. The memory wall problem has deteriorated with the advent of big data and artificial intelligence (AI) era. For example, the weights of AI related processes may be of a significant size. Thus, retrieving the weights from a long-term storage device and storing the weights in a memory may be time-consuming and incur significant overhead (e.g., processing power and computational resources).

BRIEF DESCRIPTION OF THE DRAWINGS

The various advantages of the embodiments will become apparent to one skilled in the art by reading the following specification and appended claims, and by referencing the following drawings, in which:

FIG. 4 is a flowchart of an example of a method of controlling compute in-memory operations according to embodiments herein according to an embodiment;

DESCRIPTION OF EMBODIMENTS

To reduce costly data movements and reduce latency, CiM (which may be considered in some examples to be one of the Non-von Neumann computation architectures), has become a potential candidate for current convolutional neural network (CNN) and deep neural network (DNN) applications. Currently, most of the practical CiM architectures operate with specific memory technologies (e.g., static random-access memory (SRAM), dynamic random-access memory (DRAM), magnetoresistive random-access memory (MRAM), phase-change memory (PCRAM), etc.) that are mature and readily available in various computing systems of different sizes and shapes. Conventional schemes (particularly SRAM) suffer from two problems, namely: 1) memory technology based CiM impedes the realization of a weight stationary neural network (NN) accelerator as CiM greatly reduces the overall memory density thereby increasing data transfers between in-core memory and off-core memory for many applications (e.g., image classification); and 2) conventional memory technology structures and peripherals (e.g., certain timing and address controllers to activate corresponding pull-up precharge circuit and sense amplifier in a column) greatly increase the power consumption while reducing the throughput of the CiM due to the complicated peripheral circuitry.

Figure 1:
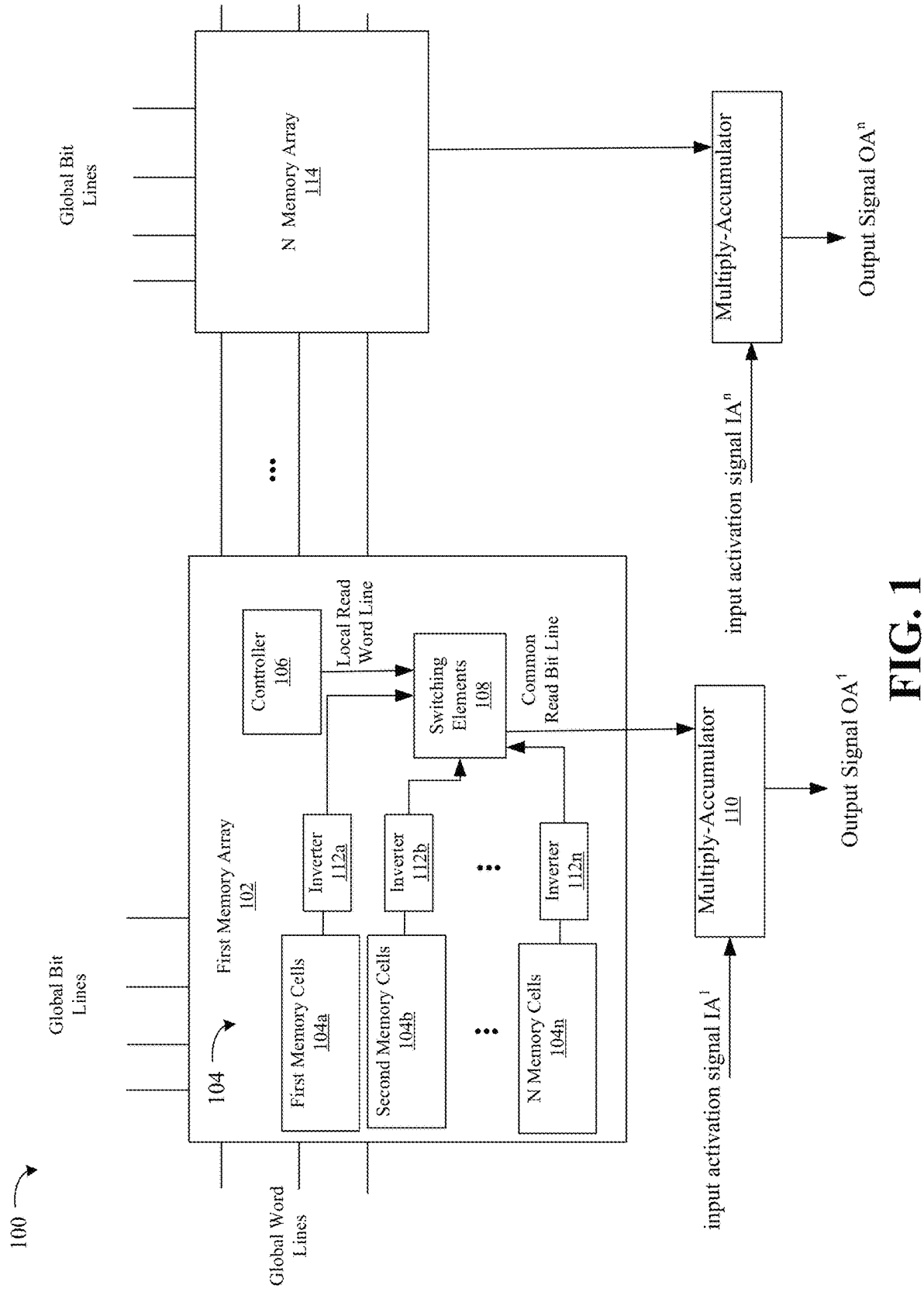
FIG. 1 is an example of a compute in-memory architecture according to an embodiment.

Turning now to FIG. 1, a CiM architecture 100 includes a plurality of memory cells 104 (e.g., SRAM, DRAM, MRAM, PCRAM, etc.) that are connected to a multiply-accumulator (MAC) 110. The plurality of memory cells 104 may be electrically connected and disconnected from the MAC 110 in a multiplexed fashion through the switching elements 108 (e.g., connection transistors, connection switches, multiplexer formed by the switches and/or transistors, etc.). In doing so, the MAC 110 is shared by the plurality of memory cells 104 and executes different operations based on different data stored in different ones of the plurality of memory cells 104. As will be explained below, the plurality of memory cells, inverters 112a-112n and switching elements 108 may form memory banks.

Sharing the MAC 110 correspondingly decreases a total number of MACs since each memory bank no longer needs a dedicated MAC. That is, conventional designs may have a 1:1 ratio of memory banks to MAC. Embodiments herein have a N:1 ratio of memory banks to MAC where N>1. Rather, the shared MAC 110 may execute operations based on data sets (e.g., weights) from a plurality of memory banks. That is, the single MAC 110 occupies less space (e.g., die space) than a plurality of MACs. Since the MAC 110 occupies less space, the area that the plurality of memory cells 104 occupies may be correspondingly expanded to increase an overall memory capacity. Thus, embodiments may have an increased memory capacity without an overall increase in size relative to conventional designs. Moreover, since the number of MACs is decreased, the MAC 110 may be increased in size (e.g., by enlarging computational units) to enhance accuracy while also increasing space dedicated to memory storage. Thus, minimal data transfers are required since data (e.g., weights) are stationary within the plurality of memory cells 104.

In some embodiments, the MAC 110 may be a C-2C ladder based charge multiplier. As noted above, the plurality of memory cells 104 share the MAC 110, thus reducing the overall area of the CiM architecture 100. As a result, the MAC 110 may be enhanced by including larger capacitors that will be used for computing, which leads to a better computation accuracy.

The first memory array 102 includes the plurality of memory cells 104 including the first memory cells 104a, second memory cells 104b and N memory cells 104n. Any number of memory cells may be included in the first-N memory cells 104a-104n. The first-N memory cells 104a-104n may store different data from each other. For example, suppose that the CiM architecture 100 is to operate a NN operation. The plurality of memory cells 104 may store weights. The first memory cells 104a may store a first weight (e.g., various memory elements store different bits of the first weight), the second memory cells 104b may store a second weight (e.g., various memory elements store different bits of the second weight) and the N memory cells 104n may store an N weight (e.g., various memory elements store different bits of the N weight), etc. The weights may be digital signals. The plurality of memory cells 104 may be divided into respective groups that each correspond to a single weight (e.g., a specific data).

In detail, the weights are obtained during a neural network training process and preloaded in the network. The weights are stored in a digital format in the plurality of memory cells 104 for information fidelity and storage robustness. With respect to the input activation (which is the analog input signal IA) and the output activation (which is the analog output signal OA), the priority may be shifted to the dynamic range and response latency. That is, analog scalars of analog signals, with an inherent unlimited number of bits and continuous time-step, outperforms other storage candidates. Thus, the CiM architecture 100 (e.g., implements a neural network) receives the analog input signal IA (e.g., an analog waveform) as an input and stores digital bits as its weight storage to enhance neural network application performance, design and power usage. The multiply-accumulator 110 may execute multiplication operations based on weight data (e.g., bits of a same weight) from the plurality of memory cells 104 and the input activation signal $IA^1$.

The plurality of memory cells 104 are connected to switching elements 108 via inverters 112a-112n. The inverters 112a-112n provide electrical isolation for data stored in the plurality of memory cells 104 during CiM operations to prevent and/or reduce corruption of data stored in the plurality of memory cells 104, and eliminates the need of additional peripheral circuits (e.g., precharge pull up logic, sense amplifier and specific timing controller, etc.) which leads to a better energy efficiency. That is, the inverters 112a-112n may block electrical interference from multiply-accumulate operations and data transfers from overwriting data in the plurality of memory cells 104. Thus, the plurality of memory cells 104 is selectively electrically coupled with and/or associated with the MAC 110 through the switching elements 108.

A controller 106 may control the switching elements 108 to control electrical connections between the plurality of memory cells 104 to the MAC 110. The controller 106 may transmit control signals to the switching elements 108 over a local read word line. The controller 106 may be implemented in logic coupled to one or more substrates, where the logic is implemented at least partly in one or more of configurable logic or fixed-functionality logic hardware.

At any one time, only one of the first-N memory cells 104a-104n may be electrically connected to the MAC 110. For example, the controller 106 may control the switching elements 108 to selectively electrically connect the plurality of memory cells 104 to the MAC 110. For example, if a neural network operation is to execute based on the first weight, controller 106 controls the switching elements 108 to electrically connect the first memory cells 104a to the MAC 110 to retrieve the first weight from the first memory cells 104a and provide the first weight to the MAC 110. Additionally, and simultaneously, the controller 106 controls the switching elements 108 to electrically disconnect the second-N memory cells 104b-104n from the MAC 110 so that the second-N weights are not provided to the MAC 110 during the neural network operation to avoid electrical disturbance.

As another example, if a neural network operation is to execute based on the second weight, controller 106 controls the switching elements 108 to electrically connect the second memory cells 104b to the MAC 110 to retrieve the second weight from the second memory cells 104b and provide the second weight to the MAC 110. Additionally, and simultaneously, the controller 106 controls the switching elements 108 to electrically disconnect the other memory cells of the plurality of memory cells 104 from the MAC 110 so that the other weights are not provided to the MAC 110 during the neural network operation to avoid electrical disturbance.

In some embodiments, the controller 106 identifies that the first memory cells 104a stores data (e.g., a weight) that is associated with a multiply-accumulate operation. The controller 106 then executes a connection operation to electrically connect the first memory cells 104a to the MAC 110 to execute the multiply-accumulate operation. At least the second memory cells 104b are electrically disconnected from the MAC 110 during the multiply-accumulate operation. The controller 106 may then execute, with the MAC 110, the multiply-accumulate operation based on the data. The multiply-accumulate operation includes a generation, with the MAC 110, of a first analog signal (e.g., output signal OA") based on multibit computation operations that are executed based on the data, and further the input activation signal $IA^1$. The connection operation includes an electrical connection of the first memory cells 104a to the MAC 110 with one or more of a first switch or a first transistor of the switching elements 108, and an electrical disconnection of the second memory cells 104b from the MAC 110 with one or more of a second switch or a second transistor of the switching elements 108. The connection operation further includes an electrical connection of the first memory cells 104a to the common read bit line (e.g., a conductor) that electrically connects to the MAC 110, where the common read bit conductor is associated with the plurality of memory cells 104, and an electrical disconnection of the second memory cell 104b from the common read bit conductor.

Thus, the MAC 110 receives a weight from the switching elements 108 over the common read bit line. The MAC 110 further receives the input activation signal $IA^1$ (e.g., an input analogue signal from a first layer of the neural network). The MAC 110 may execute a neural network operation (e.g., multiplication for a second layer of the neural network) based on the received weight and the input activation signal $IA^1$. The MAC 110 may generate an output signal $OA''$ (e.g., a low power analog voltage output) based on the neural network operation. The output signal $OA''$ may be provided to a third layer of the neural network.

While not illustrated, other memory arrays, such as the N memory array 114, are formed similarly to the first memory array 102. The global word and bit lines are connected to the first-N memory arrays 102, 114 and select specific ones of the plurality of memory cells 104, and other memory cells of the other memory arrays. The signals of the global bit and word lines may activate certain memory cells to retrieve data from the memory cells. The global bit and word lines extend through the first-N memory arrays 102, 114, while the local read word lines and common read bit lines are each specific to a respective one of the of the plurality of memory arrays.

In some embodiments, the switching elements 108 may be distributed across a plurality of memory banks. The memory banks may each include one group of memory cells that correspond to a respective weight, such as the first, second or N memory cells 104a, 104b, 104n, of the plurality of memory cells 104 and a respective inverter of the inverters 112a-112c. Each of the memory banks may comprise nine transistors.

Thus, embodiments herein may increase throughput since the first memory array 102 may support computation and memory writes simultaneously. For example, while the first memory cells 104a are electrically connected to the MAC 110 to execute computations, the controller 106 or other devices may access (e.g., read/write) from second-N memory cells 104b-104n since the second-N memory cells 104b-104n are electrically isolated from each other and the MAC 110 due to the combination of inverters 112a-n and switching elements 108. The plurality of memory cells 104 are densely packed due to the reduced number of the computational portions of the CiM architecture 100. That is, in some examples only one computational portion per memory array is provided, for example the first memory array 102 operates with only one MAC 110.

Figure 2:
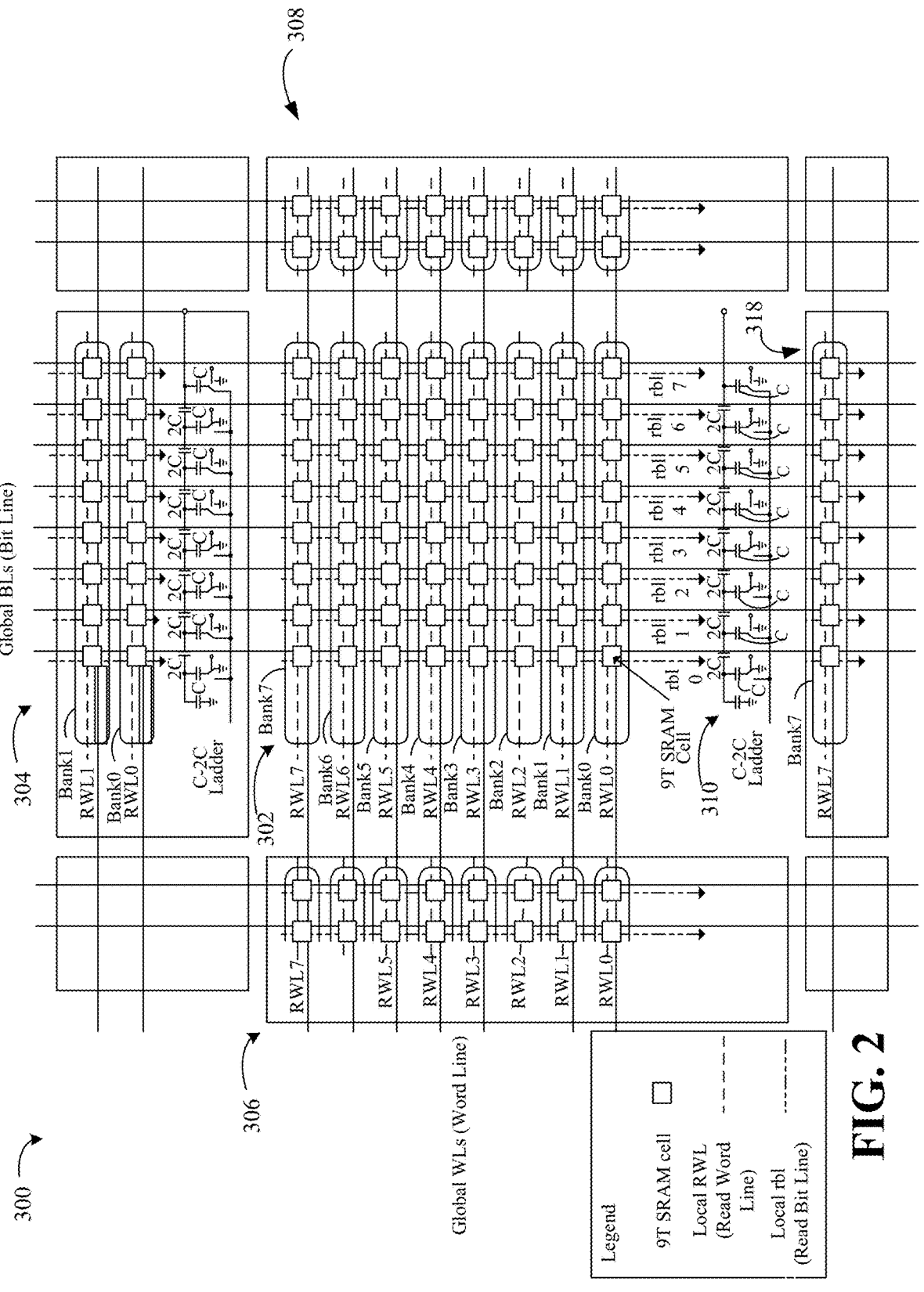
FIG. 2 is an example of a detailed schematic of a compute in-memory architecture according to an embodiment.

FIG. 2 illustrates a detailed schematic of a CiM architecture 300. A plurality of memory arrays 302, 304, 306, 308, 318 are illustrated. The CiM architecture 300 may generally implement the embodiments described herein, for example, CiM architecture 100 (FIG. 1), already discussed. For example, the CiM architecture 300 may be readily substituted for the CiM architecture 100 (FIG. 1).

The plurality of memory arrays 302, 304, 306, 308, 318 are connected to global word lines and global bit lines to activate different memory cells. Thus, the global word lines and global bit lines electrically connect to the plurality of memory arrays 302, 304, 306, 308, 318.

The plurality of memory arrays 302, 304, 306, 308, 318 each include local read word lines (RWLs) that generally extend horizontally. The RWLs carry signals from a controller, such as controller 106 (FIG. 1), to select different memory banks to connect to a C-2C ladder 310 (e.g., a MAC). The C-2C ladder 310 may correspond to the MAC 110 (FIG. 1). The first memory array 302 is illustrated in detail, but it will be understood that second, third, fourth and fifth memory arrays 304, 306, 308, 318 are similarly formed.

The first memory array 302 includes banks 0-7 (e.g., memory banks). RWL0-RWL7 extend through and electrically connect to the banks 0-7 respectively. At any one time, only one of the RWL0-RWL7 carries a connection signal to connect a respective bank to the C-2C ladder 310. For example, the controller may generate the connection signal and transmit the connection signal over RWL0 to execute NN operations. Bank 0 will then receive the connection signal over RWL0 and internal transistors (or switches/ MUX) may connect the memory cells of bank 0 to the C-2C ladder 310. The internal transistors may correspond to the switching elements 108 (FIG. 1). Banks 2-7 would be disconnected from the C-2C ladder 310 during the operation to avoid noise. The memory elements and cells of bank 0, illustrated as the squares labeled as the 9T SRAM cells, would provide data (e.g., weight data) to the C-2C ladder 310 over the read bit lines (rbl) 0-7. The rbls 0-7 generally extend horizontally. The C-2C ladder 310 may then execute the operation (e.g., multiply and accumulate) based on the data and an input signal.

Thereafter, another one of the banks 0-7 may be selected. For example, the controller may provide a connection signal to bank 6 over RWL6 so that bank 6 is electrically connected (e.g., with internal transistors of bank 6) to the C-2C ladder 310. The internal transistors of bank 6 may also correspond to the switching elements 108 (FIG. 1). The memory cells of bank 6 may then transmit data to the C-2C ladder 310 over rb10-rb17. Notably, the banks 0-7 may transmit data to the C-2C ladder 310 over the same rb10-rb17 at different times and in a multiplexed fashion. Furthermore, the banks 0-7 operate with the same C-2C ladder 310. It also bears note that each of the banks 0-7 includes different memory elements and cells arranged on different lines of rb10-rb17. Each of the memory elements and cells of a bank of the banks 0-7 represents a different bit of a same data (e.g., weight). For example, the first memory element of bank 0 connected to rb10 may store a first value for 0 bit position of a first weight, the second memory element of bank 0 connected to rb11 may store a second value for 1 bit position of the first weight, and so on with the eighth memory element of bank 0 connected to rb17 storing an eighth value for $8^{th}$ bit position of the first weight.

In some embodiments, data may be stored into the plurality of memory arrays 302, 304, 306, 308, 318 based on timing-related information of the data. For example, suppose that first, second, third and fourth weights are associated with a same first layer of a NN and are identified as likely to serve as inputs to different computations that execute at similar timings (e.g., concurrently). The first, second, third and fourth weights may be dispersed throughout the plurality of memory arrays 302, 304, 306, 308, 318. For example, the first weight may be stored in a bank of the first memory array 302, the second weight may be stored in a bank of the second memory array 304, the third weight may be stored in a bank of the third memory array 306 and the fourth weight may be stored in a bank of the fourth memory array 308. Dispersing the first, second, third and fourth weights among the plurality of memory arrays 302, 304, 306, 308, 318 may reduce and/or prevent waiting due to a MAC being unavailable (e.g., an operation based on the first weight may need to wait if the MAC is executing an operation based on the second weight).

Figure 3A:
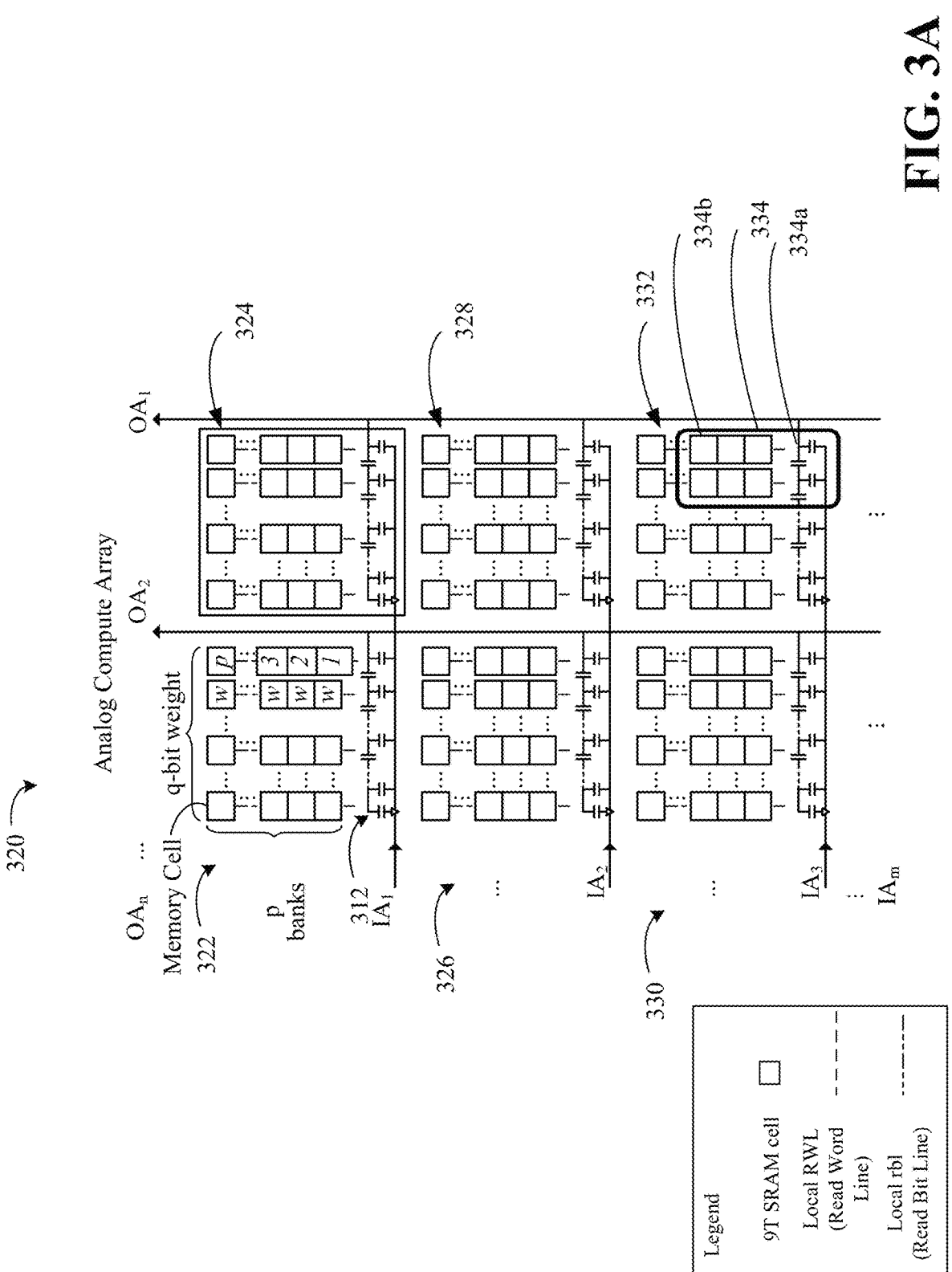
FIG. 3A is an example of a schematic view of an analog compute array according to an embodiment.

FIG. 3A illustrates a schematic view of an analog compute array 320. The analog compute array 320 may generally implement and/or be combined with the embodiments described herein, for example, CiM architecture 100 (FIG. 1) and/or CiM architecture 300 already discussed. For example, the analog compute array 320 may be readily substituted for the CiM architecture 100 (FIG. 1) and/or CiM architecture 300 (FIG. 2). The analog compute array 320 includes a plurality of CiM arrays 322, 324, 326, 328, 330, 332. While the first CiM array 322 is discussed, it will be understood that the other CiM arrays 324, 326, 328, 330, 332 may be similarly formed.

The first CiM array 322 includes p banks that comprise memory cells represented as squares. Each of the p banks stores a q-bit weight in memory cells (e.g., each memory cell stores one bit of the q-bit weight). A C-2C ladder 312 of the first CiM array 322 receives an input signal $IA_1$. One of the p banks is connected to the C-2C ladder 312 to provide a weight to the C-2C ladder 312. The first CiM array 322 may execute an operation based on the weight and the input signal $IA_1$ to generate an output signal $OA_2$. In the CiM array 332, one RBL (vertical dashed lines running through the memory cells) is connected to the memory cells in one column, and RBLs connect the C-2C ladder 312 to the memory cells.

Figure 3B:
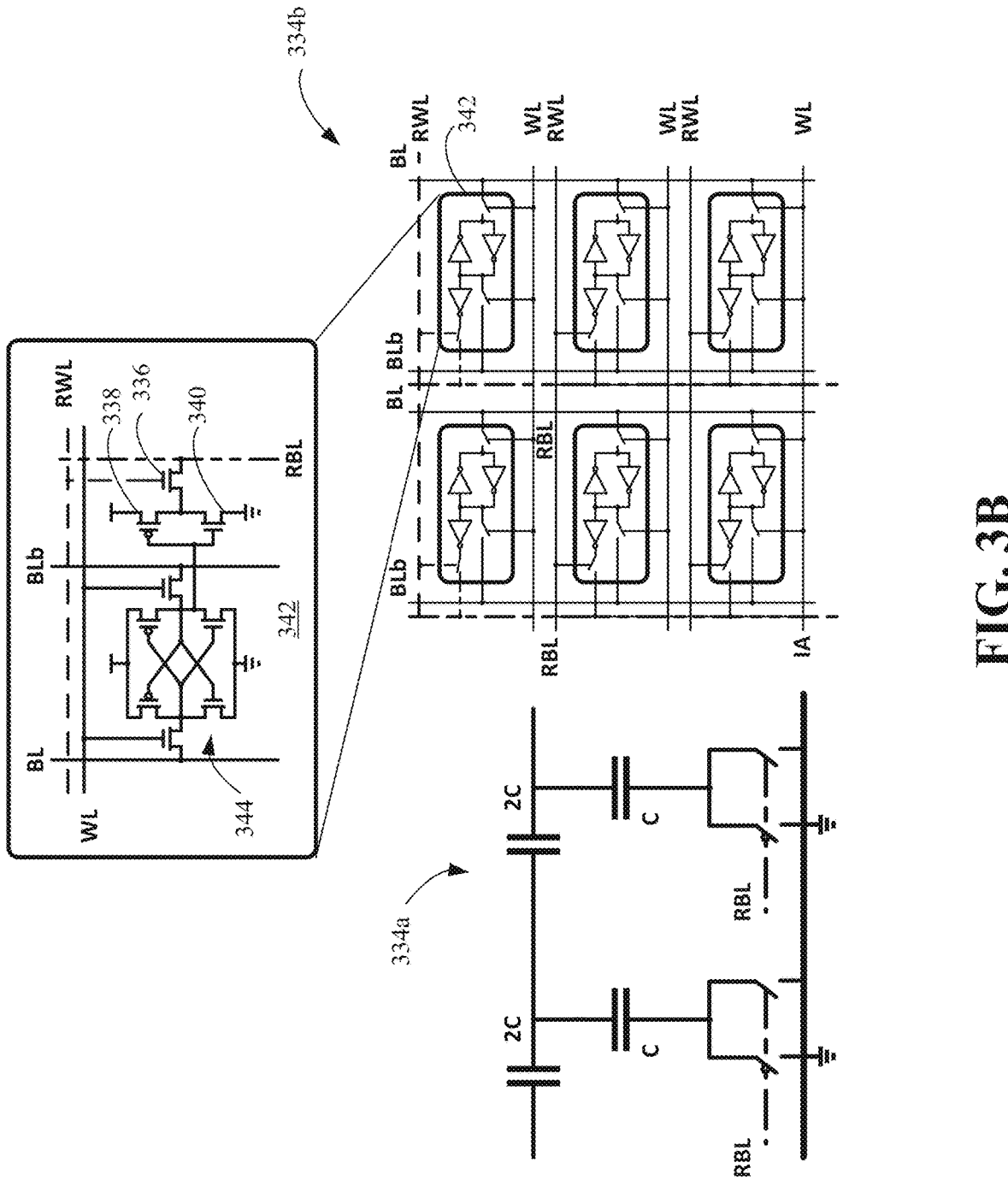
FIG. 3B is an example of a detailed views of portions of the analog compute array according to an embodiment.

A portion 334 of the CiM array 332 includes a memory part 334b and a C-2C part 334a. The portion 334 is illustrated in detail in FIG. 3B. In FIG. 3B, the memory part 334b includes a plurality of memory elements including a first memory element 342. The first memory element 342 includes a first transistor 336 that operates as a switch based on the signal from an RWL. That is, the RWL connects to the gate of the first transistor 336 to place the first transistor 336 in an ON state (i.e., conducting) or OFF state (non-conducting). The first transistor 336 is thus controlled by the RWL.

Second and third transistors 338, 340 are connected to a first side of the first transistor 336. The second and third transistors 338, 340 operate as an inverter. The inverter is inserted to provide better isolation for the data stored in memory cell 344 (e.g., an SRAM) during CiM operations, and eliminates the need of additional peripheral circuits (e.g., the pre-charge pull up logic, sense amplifier and specific timing controller), which leads to a better energy efficiency and reduced circuitry. That is, one side of a latch of the memory cell 344 is tied to an input of the inverter formed by second and third transistors 338, 340, which prevents data stored in the memory cell 344 from being corrupted by external noise and disturbance. The first transistor 336 connects an output of the second and third transistor 338, 340 (i.e., the inverter) and the RBL to provide extra isolation and configurability from data being transmitted over the RBL from other memory cells connected to the RBL.

Thus, some embodiments provide a 9T SRAM cell illustrated in the first memory element 342. That is, memory element includes 6 transistors in the memory cell 344, as well as first, second and third transistors 336, 338, 340. The throughput of the CiM computing in embodiments herein is improved since the 9T structure may support computation and memory writes simultaneously. Embodiments provide a structure of a memory cell to provide additional stability, performance and robustness.

FIG. 4 shows a method 450 of controlling CiM operations according to embodiments herein. The method 450 may generally be implemented with the embodiments described herein, for example, the CiM architecture 100 (FIG. 1), CiM architecture 300 (FIG. 2), and/or analog compute array 320 (FIG. 3) already discussed. More particularly, the method 450 may be implemented in one or more modules as a set of logic instructions stored in a machine- or computer-readable storage medium such as random access memory (RAM), read only memory (ROM), programmable ROM (PROM), firmware, flash memory, etc., in hardware, or any combination thereof. For example, hardware implementations may include configurable logic, fixed-functionality logic, or any combination thereof. Examples of configurable logic include suitably configured programmable logic arrays (PLAs), field programmable gate arrays (FPGAs), complex programmable logic devices (CPLDs), and general purpose microprocessors. Examples of fixed-functionality logic include suitably configured application specific integrated circuits (ASICs), combinational logic circuits, and sequential logic circuits. The configurable or fixed-functionality logic can be implemented with complementary metal oxide semiconductor (CMOS) logic circuits, transistor-transistor logic (TTL) logic circuits, or other circuits.

For example, computer program code to carry out operations shown in the method 450 may be written in any combination of one or more programming languages, including an object-oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Illustrated processing block 452 identifies that a first memory cell of a plurality of memory cells stores data that is associated with a multiply-accumulate operation. The plurality of memory cells is associated with a MAC. Illustrated processing block 454 executes a connection operation to electrically connect the first memory cell to the MAC to execute the multiply-accumulate operation, where a second memory cell of the plurality of memory cells is electrically disconnected from the MAC during the multiply-accumulate operation. Illustrated processing block 456 executes, with the MAC, the multiply-accumulate operation based on the data. In some embodiments, the multiply-accumulate operation includes a generation, with the MAC, of a first analog signal based on multibit computation operations that are executed based on the data. In some embodiments, the connection operation includes an electrical connection of the first memory cell to the MAC with one or more of a first switch or a first transistor, and an electrical disconnection of the second memory cell from the MAC with one or more of a second switch or a second transistor.

In some embodiments, the connection operation includes an electrical connection of the first memory cell to a common read bit conductor that electrically connects to the MAC, where the common read bit conductor is associated with the plurality of memory cells. The connection operation may also include an electrical disconnection of the second memory cell from the common read bit conductor. The data is weight data associated with a neural network operation. In some embodiments, plurality of memory cells forms a memory array, and the memory array includes a plurality of inverters that is to electrically isolate the plurality of memory cells from noise. In some embodiments, the plurality of memory cells is a static random-access memory, a dynamic random-access memory, a magnetoresistive random-access memory or a phase-change memory. The MAC may include a C-2C ladder that includes capacitors. Thus, embodiments herein may share a MAC among different memory cells to reduce overall CiM size while increasing memory density and computational accuracy.

Figure 5:
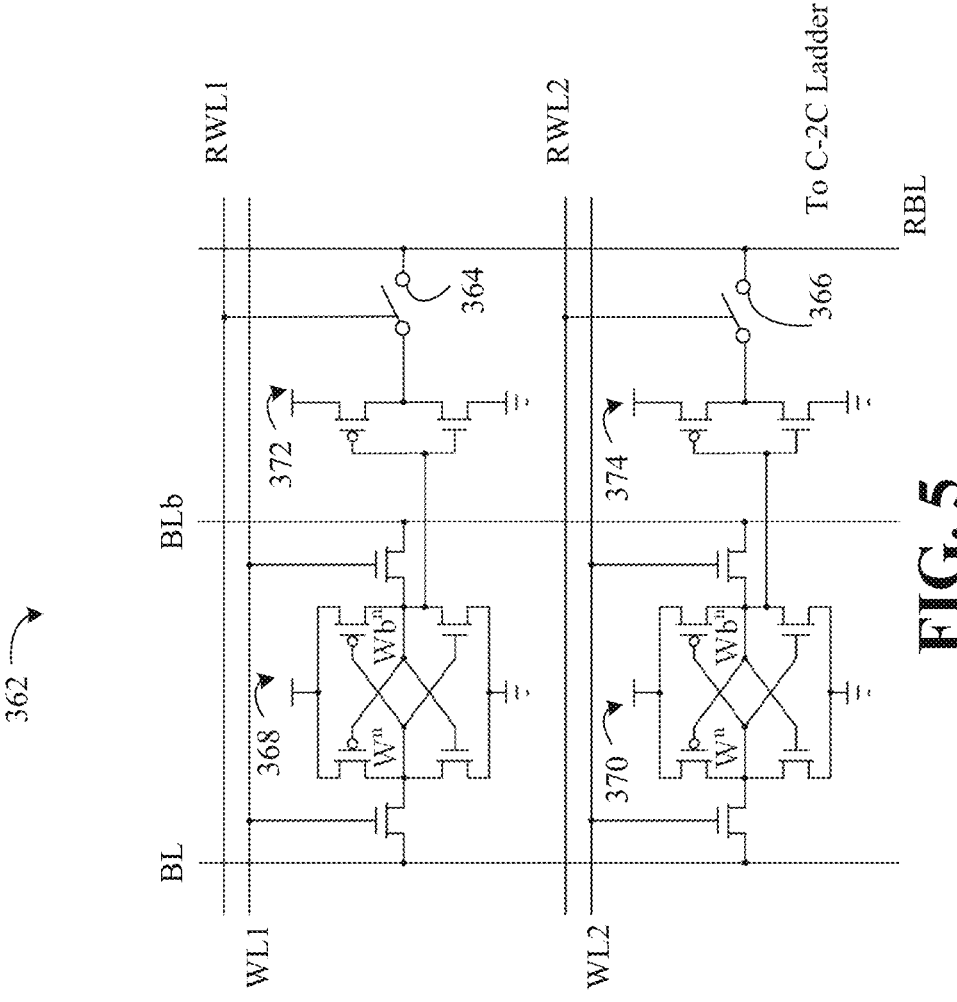
FIG. 5 is an example of an enhanced compute in-memory architecture with multiple memory cells according to an embodiment.

FIG. 5 shows an enhanced CiM architecture 362 with multiple memory cells. The CiM architecture 362 may generally implement and/or be combined with the embodiments described herein, for example, CiM architecture 100 (FIG. 1), CiM architecture 300 (FIG. 2), analog compute array 320 (FIG. 3) and/or method 450 (FIG. 4) already discussed. The C-2C ladder control signal cannot be directly obtained from the internal node in the memory cell to avoid noise. As memory cells normally hold different values, the data will be corrupted if the memory cells are tied together. Thus, the CiM architecture 362 includes dedicated switches 364, 366 that positioned at a gate between the internal nodes of the memory cells 368, 370 and the shared control signal wire RBL. Even with the gating switches 364, 366, the data stored in memory cells 368, 370 may still be corrupted when switching between different memory cells. Such corruptions may be caused by the backfire phenomenon, as there might be some charge residue left on the control signal wire RBL which can lead to a polarity flipping in the latches of the memory cells 368, 370. Thus, transistors 372, 374 are inserted to operate as inverters. One side of the memory cells 368, 370 are tied to the input of the added inverters, which prevents the stored data from being corrupted by external noise and disturbance from the shared control signal wire RBL. Switches 364, 366 may be opened and closed based on signals from a controller, the signals being transmitted via the RWL1, RWL2 conductors.

Figure 6:
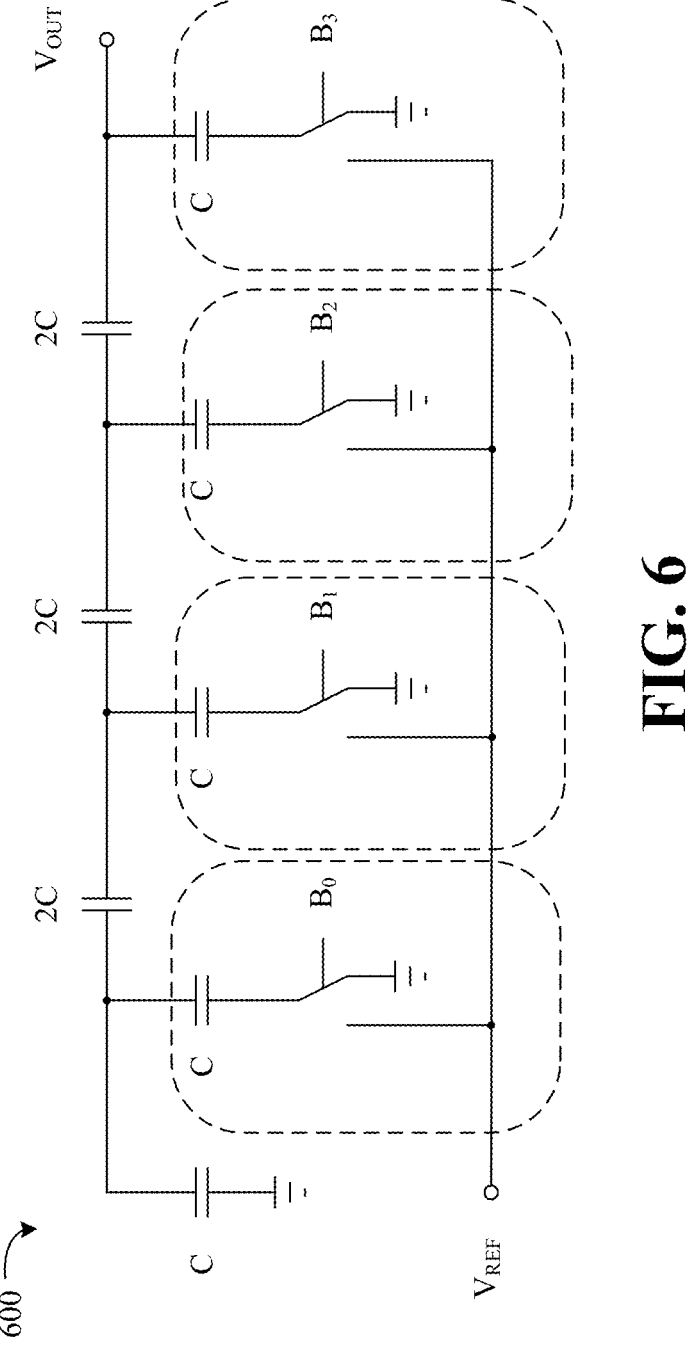
FIG. 6 is an example of C-2C ladder according to an embodiment.

FIG. 6 illustrates a C-2C ladder 600. The C-2C ladder 600 may generally implement and/or be combined with the embodiments described herein, for example, CiM architecture 100 (FIG. 1), CiM architecture 300 (FIG. 2), analog compute array 320 (FIG. 3A), method 450 (FIG. 4) and/or CiM architecture 362 (FIG. 5) already discussed. For example, the C-2C ladder may be readily substituted for the MAC 110 (FIG. 1), C-2C ladder (FIG. 2), C-2C ladder 312 (FIG. 3A) and/or C-2C part 334*a* (FIG. 3B).

Embodiments relate to a capacitor based charge domain multiply—accumulate in-memory operator. To extend precision from only 1-bit to a multiple number of bits, embodiments include an in-memory cell charge domain multiplication process using the C-2C ladder 600. The multiplication is performed by the structure of the C-2C ladder 600 which may be included in digital-to-analog converter (DAC) designs. As illustrated in FIG. 6, the C-2C ladder 600 includes a series of capacitors C segmented into branches that are shown in dashed outlines. Each branch contains a switch and a capacitor with one unit capacitance C. A serial capacitor, with a capacitance of two unit capacitance 2C, is inserted between each of two branches. The switches are controlled by digital bits $B_0$-$B_3$ (e.g., bits of a weight which are stored in different memory cells of a same memory bank as described above) and connected to either a fixed reference voltage VREF or ground node (GND). For example, if a stored bit (i.e., one of digital bits $B_0$-$B_3$) is a '1' the corresponding switch is connected to $V_{ref}$. If the stored bit is a '0,' the corresponding switch is connected to ground. Ratioed by the serial capacitors, the contributions of those branches are binary weighted along the ladder and superimposed onto the output node of the ladder. As a result, the voltage at the output corresponds to the digital bits applied to those switches with a scaling factor of VREF, as expressed in the following equation:

$$V_{OUT} = V_{REF} \sum_{i=0}^{m-1} B_i \times \frac{1}{2^{m-i}}$$

Equation 1

In Equation 1, m is the number of branches in the ladder. One pair of C-2C branches corresponds to one digital bit, which makes scaling up possible up to any arbitrary number of desired bits. For instance, in FIG. 6, the C-2C ladder 600 has four branches to represent a 4-bit value. If eight bits were desired to be represented in the C-2C ladder 600, four branches could be added to the C-2C ladder 600 bringing the total number of branches up to eight branches. That is, each branch represents one bit, and the number of branches is therefore scaled based on the number of bits to be represented. Further, by replacing the scaling factor VREF in Equation 1 with the input activation signal (IA) of a neural network workload, and by controlling the switches based on the weight (W) of the neural network workload, then the output of the ladder becomes the product of the IA and W.

In this example, each of the bits $B_0$-$B_4$ is stored in a different memory of a same memory banks. For example, the bit $B_0$ may be stored in a first memory cell, the bit $B_1$ may be stored in a second memory cell, the bit $B_2$ may be stored in a third memory cell and the bit $B_3$ may be stored in a fourth memory cell.

Figure 7:
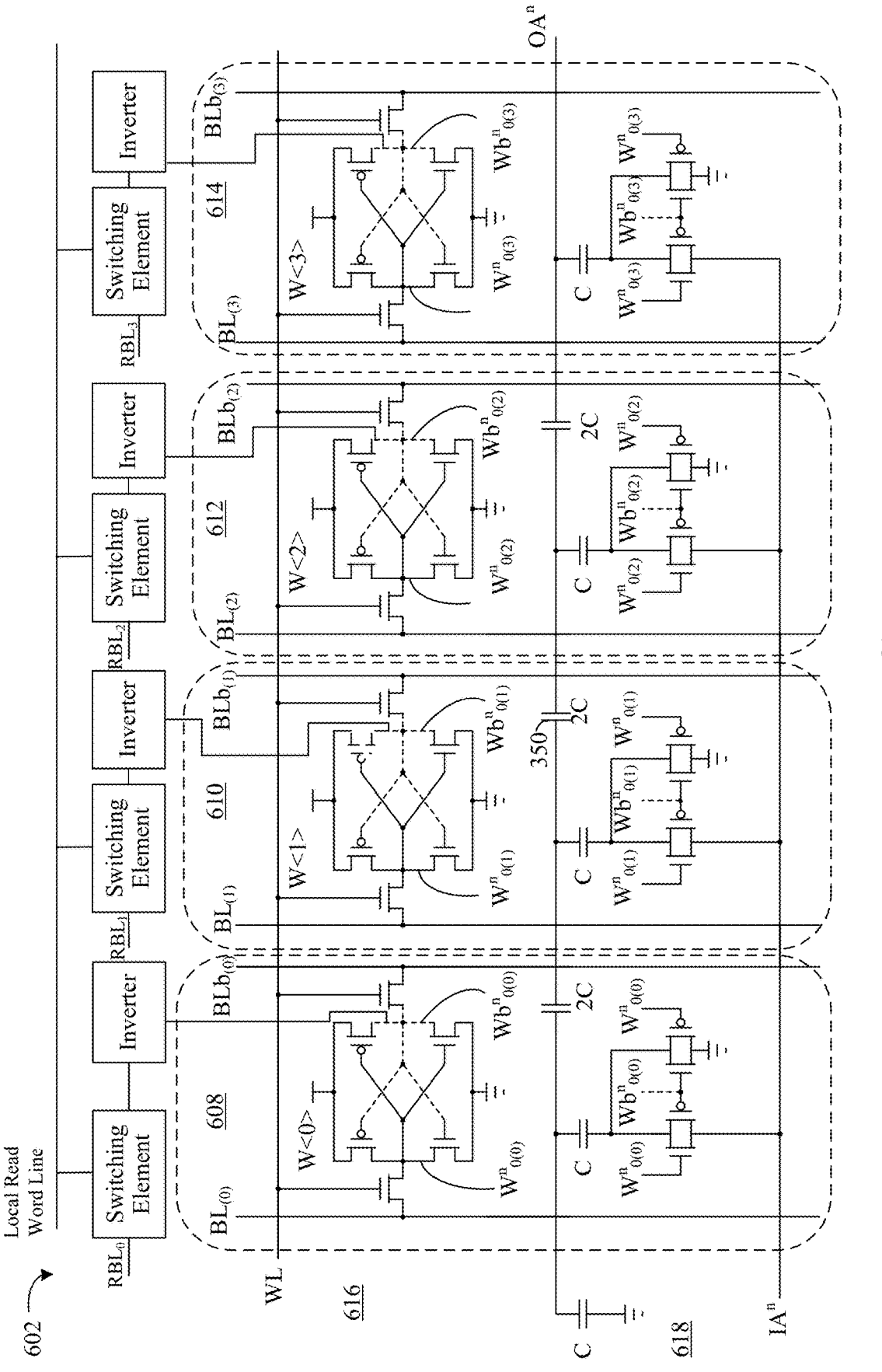
FIG. 7 is an example of a detailed structure of an in-memory C-2C ladder multiplier according to an embodiment.

FIG. 7 gives a detailed structure of an in-memory C-2C ladder multiplier 602 that forms a compact in-memory computing scheme. The in-memory C-2C ladder multiplier 602 may generally implement and/or be combined with the embodiments described herein, for example, CiM architecture 100 (FIG. 1), CiM architecture 300 (FIG. 2), analog compute array 320 (FIG. 3A), method 450 (FIG. 4), CiM architecture 362 (FIG. 5) and/or C-2C ladder 600 (FIG. 6) already discussed. The SRAM cells 616, and C-2C ladder 618 are connected together. In detail, the SRAM cells 616 are connected to the C-2C ladder 618 via switching elements and inverters. The switching elements output different signals ($W''_{0(0)}$-$W''_{0(3)}$ and $Wb''_{0(0)}$-$Wb''_{0(3)}$) from the SRAM cells 616 over $RBL_0$, $RBL_1$, $RBL_2$, $RBL_3$ to the C-2C ladder 618. The multibit weight is stored in SRAM cells in the digital format, while the analog $IA''$ signal is applied to the lower wire of the C-2C ladder 618 as illustrated. Transmission gate formed switches on the C-2C ladder control the data stored in a corresponding SRAM cell of the SRAM cells 616. The product is then obtained at the output node at the output $OA''$ of the C-2C ladder 618. The equation of an m-bit multiplier is provided below in Equation 2:

$$IA \times \sum_{i=0}^{m-1} W_i \times \frac{1}{2^{m-i}}$$

Equation 2

The transistors of the C-2C ladder selectively couple the input analog signal $IA''$ (e.g., input activation) or ground to capacitors C based on weight signals $W''_{0(0)}$-$W''_{0(3)}$ and $Wb''_{0(0)}$-$Wb''_{0(3)}$. Thus, the capacitors are selectively electrically coupled to the ground or the input analog signal $IA''$ based on the weight signals $W''_{0(0)}$-$W''_{0(3)}$ and $Wb''_{0(0)}$-$Wb''_{0(3)}$.

The most basic unit is a one-bit arithmetic memory cell (AMC) 608, 610, 612, 614 is circled by each of the boxes, where each of the AMC 608, 610, 612, 614 contains in total 10 CMOS transistors and 3 unit metal capacitors. Each of the first-fourth arithmetic memory cell 608, 610, 612, 614 provides an output based on the same input activation signal $IA''$ but also on a different bit of the same weight. Ratioed by the 2C capacitors that are aligned in serial with each other, the contributions of the different branches (i.e., whether the capacitors C are charged by $IA''$ or discharged by ground) are binary weighted along the ladder and superimposed onto an output node of the C-2C ladder 618. As a result, the voltage of analog output signal $OA''$ (e.g., at the output)

corresponds to the digital bits applied to the switches of the C-2C ladder 618 with a scaling factor of the analog input signal, which is described by Equation 2. The capacitors of the C-2C ladder 618 may be layered on top of the transistors of the SRAM cells 616 to save on-chip area. The AMC cells 608, 610, 612, 614 may be disposed into an SRAM array with minor modifications, thus enabling good scalability and compatibility.

The capacitor is a significant component to the charge domain computing of the C-2C ladder 618. Reducing the size of the capacitor to achieve a better on-chip area efficiency is possible, but the minimum size of the capacitor has some basic physical limitations. The two major factors that are to be considered are the thermal noise of the capacitor and the variation of the capacitor implementation. It is to be noted that memory cell sizes of the SRAM cells 616 may be dominated by the size of the capacitor. The size of the capacitor has a low limit, which is calculated based on its physical thermal noise, as explained in the following equation 3:

$$\overline{v_n^2} = \frac{k_B T}{C} \qquad \text{Equation 3}$$

In Equation 3, $$\overline{v_n^2}$$

is the noise power, $k_B$ is Boltzmann's constant in joules per kelvin, T is the absolute temperature in kelvins, C is the capacitance of the capacitor. With equation 3, it can be clearly observed that the noise is inversely proportional to the capacitance, which means a larger capacitor size improves the computational accuracy.

An ideal capacitor, as a lossless device, does not have thermal noise, but as commonly used with resistor in an RC circuit or when consider the parasitic resistance on the capacitor, the combination has what is called kT/C noise. The noise bandwidth of an RC circuit is provided by Equation 4:

$$\Delta f = 1/(4RC) \qquad \text{Equation 4}$$

When Equation 4 is substituted into the thermal noise equation of Equation 3, the result has a simple form as the value of the resistance (R) drops out of the equation. This is because higher R decreases the bandwidth as much as the resistance (R) increases the noise. The average noise power may be represented by the RMS which describes the corresponding noise voltage generated in such a filter. The RMS is provided by Equation 5:

$$\overline{v_n^2} = \frac{4k_B T R}{4RC} = \frac{k_B T}{C} \qquad \text{Equation 5}$$

In Equation 5, $k_B$ is the Boltzmann constant and T is the ambient temperature. Embodiments also seek to reduce the thermal noise of the capacitor to be smaller than the quantization noise introduced by the number of bits (NoBs) defined in the system. The noise power of the quantization noise is shown below by Equation 6:

$$\overline{e_q^2} = \frac{\Delta^2}{12} \qquad \text{Equation 6}$$

In Equation 6, $\Delta$ is the amplitude of the Least Significant Bit (LSB).

Figure 10:
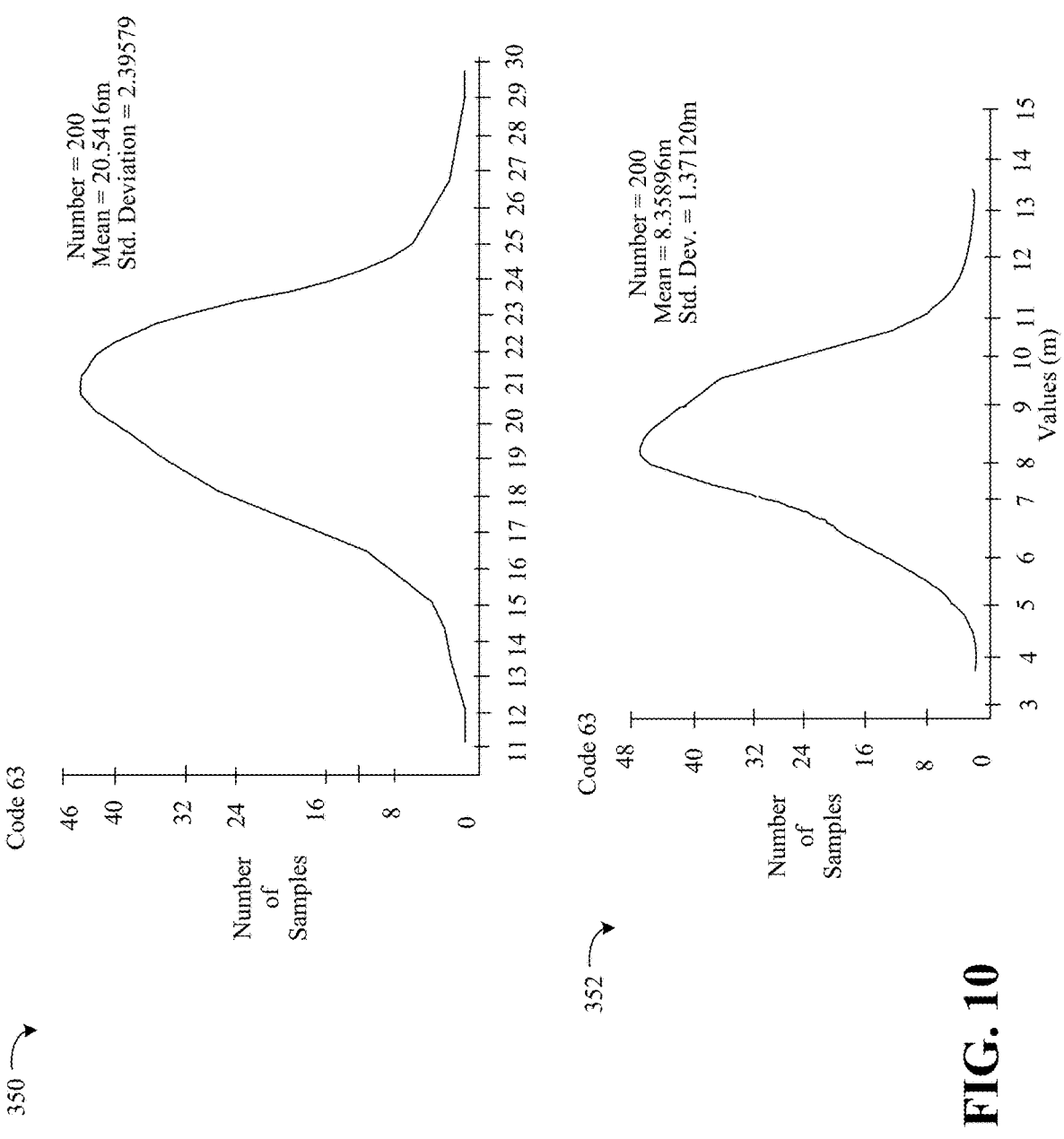
FIG. 10 is an example of a schematic representation of Monte Carlo simulation results according to an embodiment.

A consideration is implementation mismatch. For example, FIG. 10 illustrates a Monte Carlo simulation results of a 1fF unit capacitance C-2C ladder 350 and a 2fF unit capacitance C-2C ladder 352. The ratio of the capacitance in the ladder has a direct impact on the accuracy of the MAC operation. Capacitor size variation is inevitable during the chip fabrication. Similar to the noise, the variation of the capacitance is inversely proportional to the size of the capacitor. Mismatch effect was studied through Monte Carlo (MC) simulations. Embodiments illustrates that the standard deviation is reduced from 2.39 mV to 1.37 mV. Thus, 2fF unit capacitance is capable of supporting an 8-bit system.

To improve area efficiency, Metal-Oxide-Metal (MOM) capacitors can be implemented with Back-End-of-Line (BEOL) and placed on top of active components (SRAM transistors) to save on-chip area. As explained above, a 2fF capacitor is able to meet the 8-bit precision requirement with no design margin. Moreover, the 2fF capacitor size may be close to or even larger than a 6T SRAM cell. In order to achieve a higher accuracy, a larger capacitor is therefore implemented.

Embodiments provide an approach to meet the equilibrium of computation accuracy and area efficiency simultaneously. To do so, embodiments implement a larger capacitance than conventional designs, and allowing multiple SRAM cells to share the same C-2C ladder which is enlarged. As a result, the capacitor on top of the SRAM may be greatly enlarged.

Figure 8:
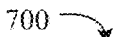
FIG. 8 is an example of an accumulation architecture according to an embodiment.

FIG. 8 illustrates an accumulation architecture 700. The accumulation architecture 700 may generally implement and/or be combined with the embodiments described herein, for example, CiM architecture 100 (FIG. 1), CiM architecture 300 (FIG. 2), analog compute array 320 (FIG. 3A), method 450 (FIG. 4), CiM architecture 362 (FIG. 5), C-2C ladder 600 (FIG. 6) and/or in-memory C-2C ladder multiplier 602 (FIG. 7) already discussed. The accumulation architecture 700 may first execute a multiplication operation of a MAC operation as discussed above, and then execute a second part of the MAC operation, which is the accumulation. The accumulation architecture 700 includes first, second and third in-memory multiplier architectures 736, 738, 740 that execute multiplication operations based on input signals $IA''_0$, $IA''_1$ and $IA''_3$ and different weights. The first, second and third in-memory multiplier architectures 736, 738, 740 output signals that represent the results of the multiplication operations.

The accumulation adds all the results from multipliers (e.g., C-2C ladders) of the first together via switches 650, 652, 654. In conventional implementations, in order to handle the overall signal range, the total amount of adders needs to match with the number of multipliers in a conventional digital MAC unit. Embodiments described herein implement a charge domain solution and the accumulation is achieved by connecting all the output nodes of the C-2C ladders together. The electric charge on the output nodes will be merged and form a summation naturally. The voltage signal at this combined node corresponds to the total charge held by the overall capacitance.

As shown in FIG. 8, a MAC unit in layer n contains k multipliers (e.g., 4). At the output of the MAC unit, electric charge from different ladders is collected together and forms the output activation (OA). Equation 7 describes the electric charge output:

$$OA^n = \frac{1}{k} \times \sum_{j=0}^{k-1} \left[ IA^n_{j \in (0 \text{ to } k-1)} \times \sum_{i=0}^{m-1} W^n_{j,i} \times \frac{1}{2^{m-i}} \right] \qquad \text{Equation 7}$$

In Equation 7, $IA^n_j$ corresponds to the input activation signal, "k" is the number of multipliers in one MAC unit, for example the accumulation architecture 700, W is the weight value, n is a layer index in a neural network associated with the accumulation architecture 700 (e.g., that will be processed), "m" is number of arithmetic memory cells per multiplier of the accumulation architecture 700 (e.g., the number of bits associated with the multipliers).

From Equation 7, it can be observed that the output activation is scaled by a factor of 1/k. Thus, the maximum of the output signal cannot exceed 1, which is the supply voltage of the system. Thus, an inherent normalization process is preformed automatically without any additional hardware. The inherent normalization also eliminates all the potential overflow conditions.

Figure 9:
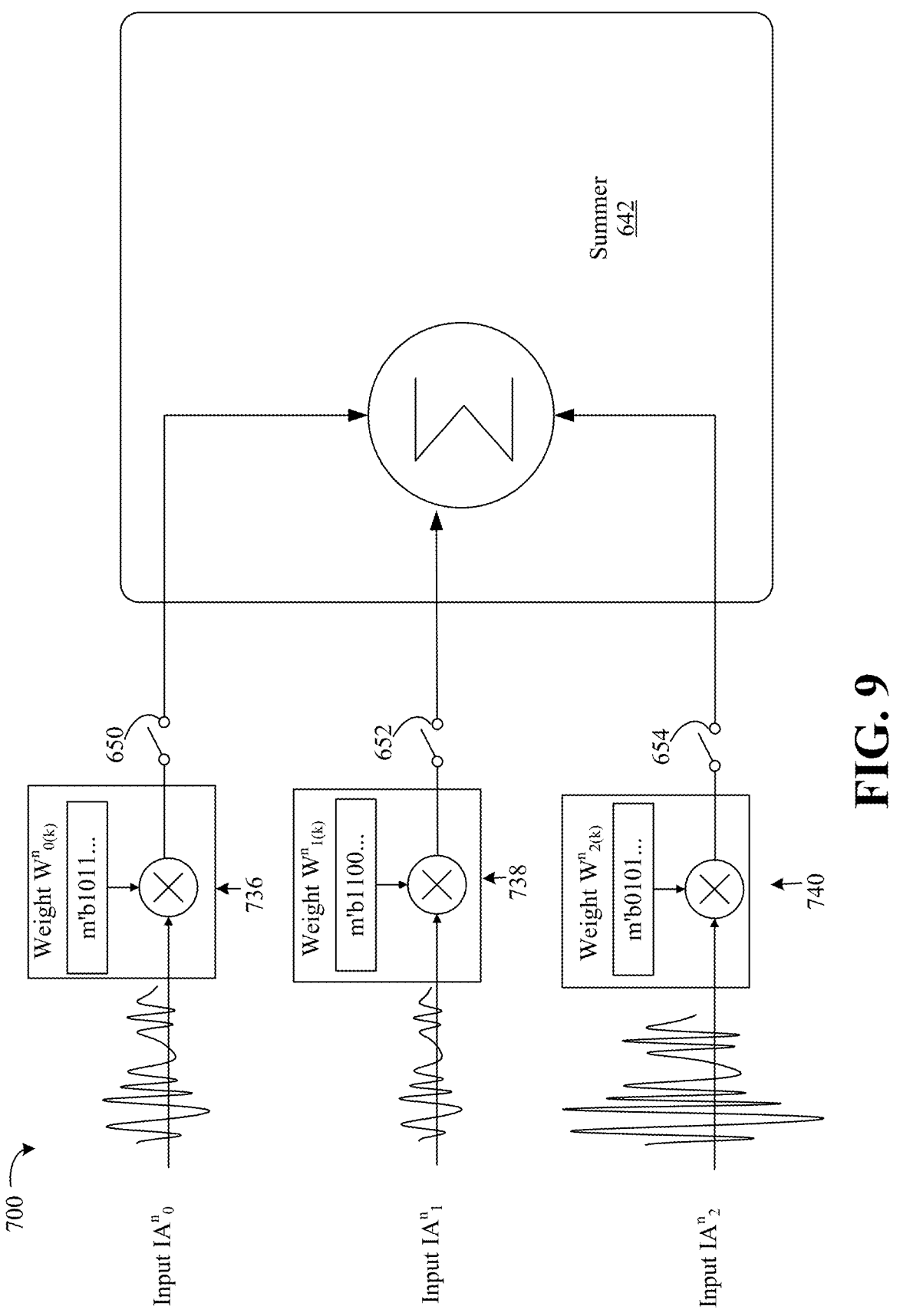
FIG. 9 is an example of a schematic representation of the operations executed by the accumulation architecture according to an embodiment.

FIG. 9 illustrates a schematic representation of the operations executed by the accumulation architecture 700. In FIG. 9, input analog signals $IA^n_0$-$IA^n_2$ are input into the first, second and third in-memory multiplier architectures 736, 738, 740. The first, second and third in-memory multiplier architectures 736, 738, 740 also include different weights $W^n_{0(k)}$-$W^n_{2(k)}$. Outputs of the first, second and third in-memory multiplier architectures 736, 738, 740 are combined in the summer 642.

Figure 11:
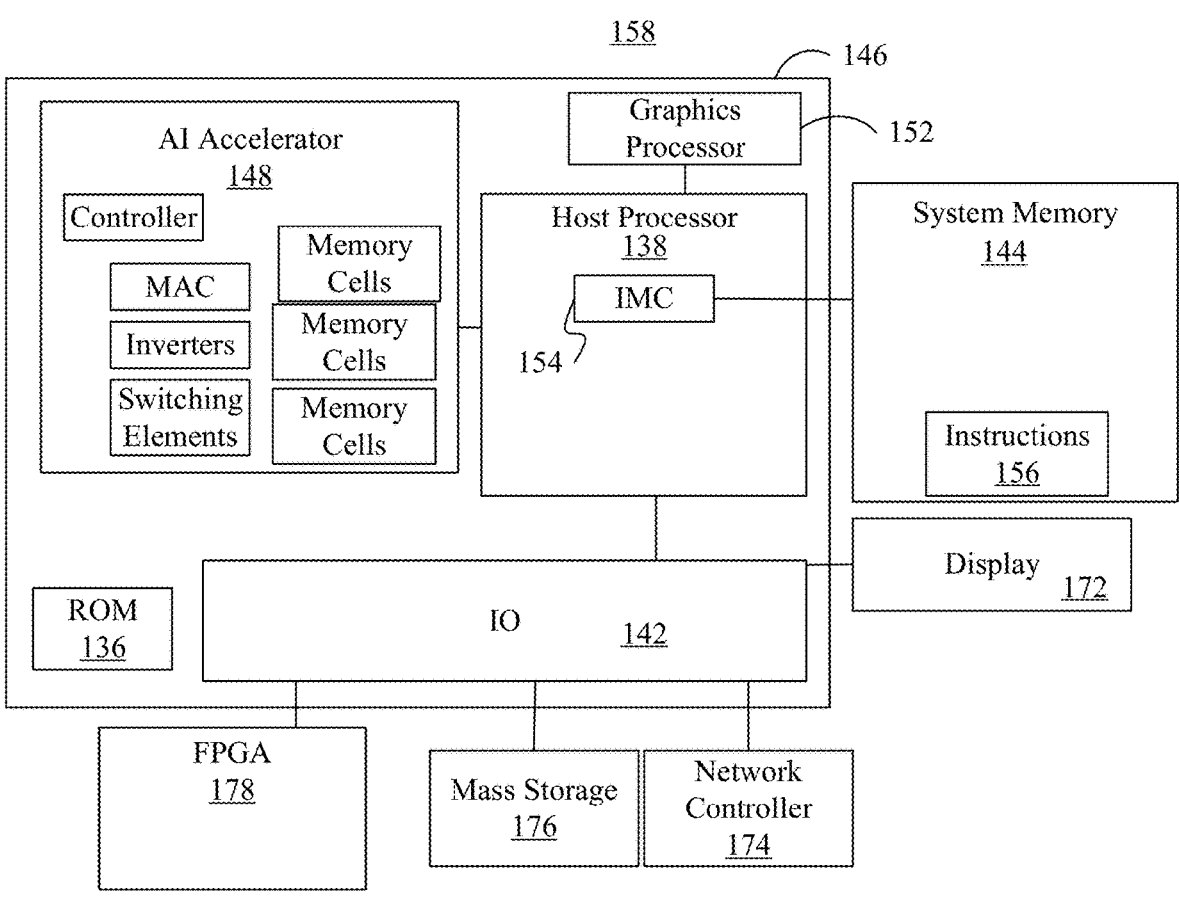
FIG. 11 is a diagram of an example of an efficiency-enhanced computing system according to an embodiment.

Turning now to FIG. 11, an efficiency-enhanced and performance-enhanced CiM system 158 is shown. The computing system 158 may generally be part of an electronic device/platform having computing functionality (e.g., personal digital assistant/PDA, notebook computer, tablet computer, convertible tablet, server), communications functionality (e.g., smart phone), imaging functionality (e.g., camera, camcorder), media playing functionality (e.g., smart television/TV), wearable functionality (e.g., watch, eyewear, headwear, footwear, jewelry), vehicular functionality (e.g., car, truck, motorcycle), robotic functionality (e.g., autonomous robot, autonomous vehicle, etc.), edge device (e.g., mobile phone, desktop, etc.) etc., or any combination thereof. In the illustrated example, the computing system 158 includes a host processor 138 (e.g., CPU) having an integrated memory controller (IMC) 154 that is coupled to a system memory 144.

The illustrated computing system 158 also includes an input output (IO) module 142 implemented together with the host processor 138, the graphics processor 152 (e.g., GPU), ROM 136, and AI accelerator 148 on a semiconductor die 146 as a system on chip (SoC). The illustrated IO module 142 communicates with, for example, a display 172 (e.g., touch screen, liquid crystal display/LCD, light emitting diode/LED display), a network controller 174 (e.g., wired and/or wireless), FPGA 178 and mass storage 176 (e.g., hard disk drive/HDD, optical disk, solid state drive/SSD, flash memory). The SoC 146 may further include processors (not shown) and/or the AI accelerator 148 dedicated to artificial intelligence (AI) and/or neural network (NN) processing. For example, the system SoC 146 may include vision processing units (VPUs,) and/or other AI/NN-specific processors such as AI accelerator 148, etc. In some embodiments, any aspect of the embodiments described herein may be implemented in the processors, such as the graphics processor 152 and/or the host processor 138, and in the accelerators dedicated to AI and/or NN processing such as AI accelerator 148 or other devices such as the FPGA 178.

The graphics processor 152, AI accelerator 148 and/or the host processor 138 may execute instructions 156 retrieved from the system memory 144 (e.g., a dynamic random-access memory) and/or the mass storage 176 to implement aspects as described herein. For example, a controller of the AI accelerator 148 may identify that a first memory cell of a plurality of memory cells of the memory stores data that is associated with a multiply-accumulate operation, where the plurality of memory cells is associated with a MAC. The controller then executes a connection operation (with the switching elements) to electrically connect the first memory cell to the MAC to execute the multiply-accumulate operation, where a second memory cell of the plurality of memory cells of the memory is electrically disconnected from the MAC during the multiply-accumulate operation. The controller then executes, with the MAC, the multiply-accumulate operation based on the data. Inverters electrically isolate the memory cells from each other. While the MAC, controller, inverters, switching elements and memory are illustrated as part of the AI accelerator 148, it will be understood that the MAC, controller, inverters, switching elements and memory may be included in graphics processor 152, system memory 144, and/or mass storage 176. That is, the MAC, controller, inverters, switching elements and memory may be positioned anywhere there is memory in a cache-like structure to reduce communication overhead for compute. When the instructions 156 are executed, the computing system 158 may implement one or more aspects of the embodiments described herein. For example, the computing system 158 may implement one or more aspects of the embodiments described herein, for example, CiM architecture 100 (FIG. 1), CiM architecture 300 (FIG. 2), analog compute array 320 (FIG. 3A), method 450 (FIG. 4), CiM architecture 362 (FIG. 5), C-2C ladder 600 (FIG. 6), in-memory C-2C ladder multiplier 602 (FIG. 7), and/or accumulation architecture 700 (FIGS. 8 and 9), already discussed. The illustrated computing system 158 is therefore considered to be an efficiency-enhanced and hardware-enhanced at least to the extent that the computing system 158 reduces latency and energy to execute neural network operations and may execute with enhanced accuracy.

Figure 12:
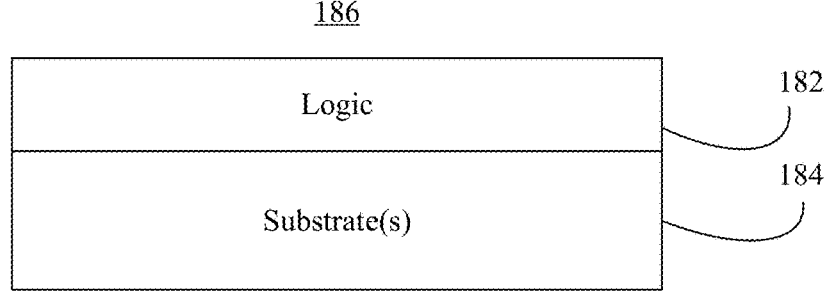
FIG. 12 is an illustration of an example of a semiconductor apparatus according to an embodiment.

FIG. 12 shows a semiconductor apparatus 186 (e.g., chip, die, package). The illustrated apparatus 186 includes one or more substrates 184 (e.g., silicon, sapphire, gallium arsenide) and logic 182 (e.g., transistor array and other integrated circuit/IC components) coupled to the substrate(s) 184. In an embodiment, the apparatus 186 is operated in an application development stage and the logic 182 performs one or more aspects of the embodiments described herein, for example, The apparatus 186 may generally implement the embodiments described herein, for example, CiM architecture 100 (FIG. 1), CiM architecture 300 (FIG. 2), analog compute array 320 (FIG. 3A), method 450 (FIG. 4), CiM architecture 362 (FIG. 5), C-2C ladder 600 (FIG. 6), in-memory C-2C ladder multiplier 602 (FIG. 7), and/or accumulation architecture 700 (FIGS. 8 and 9), already discussed. The logic 182 may be implemented at least partly in configurable logic or fixed-functionality hardware logic. In one example, the logic 182 includes transistor channel regions that are positioned (e.g., embedded) within the substrate(s) 184. Thus, the interface between the logic 182 and the substrate(s) 184 may not be an abrupt junction. The logic 182 may also be considered to include an epitaxial layer that is grown on an initial wafer of the substrate(s) 184.

Figure 13:
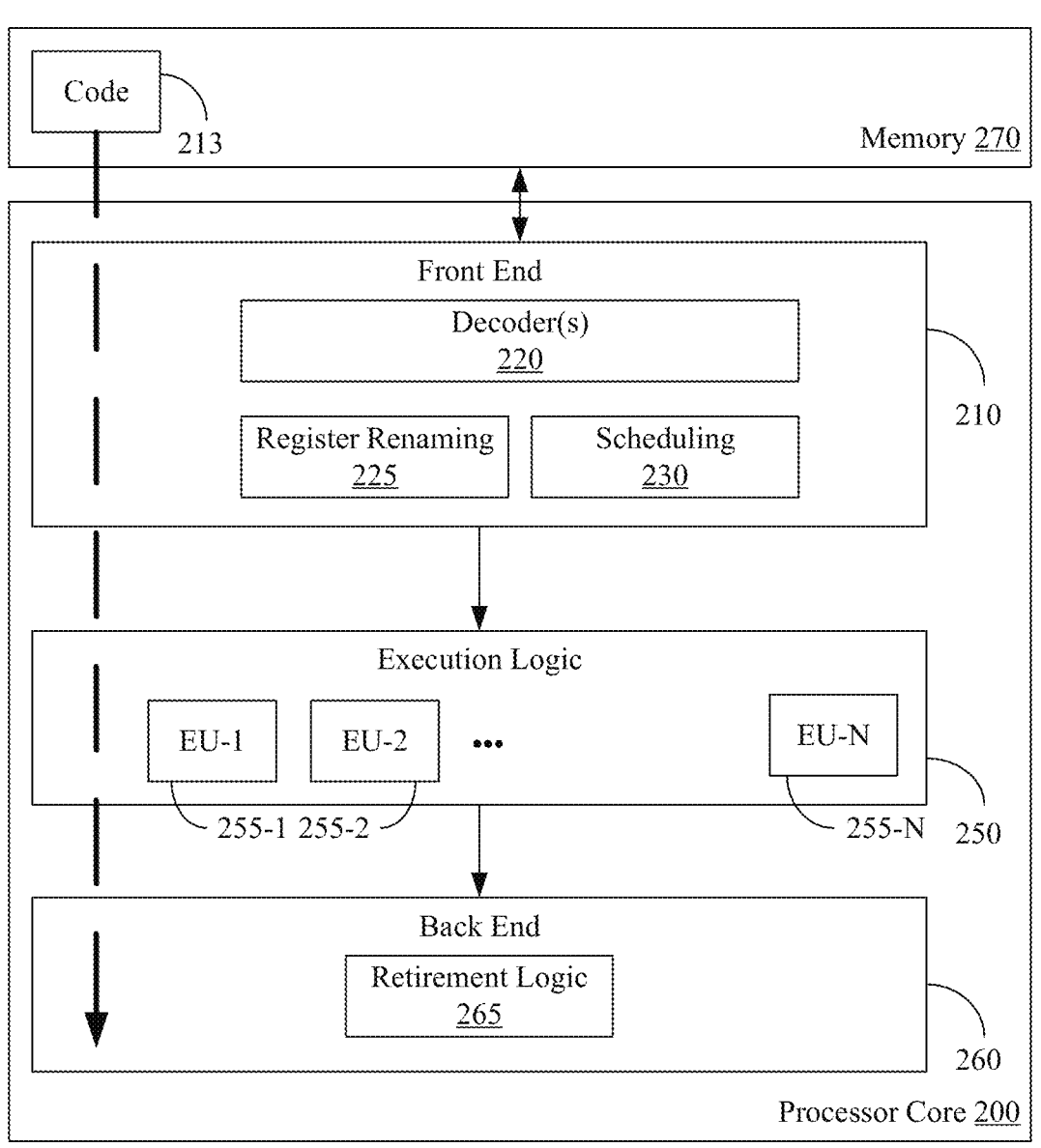
FIG. 13 is a block diagram of an example of a processor according to an embodiment.

FIG. 13 illustrates a processor core 200 according to one embodiment. The processor core 200 may be the core for any type of processor, such as a micro-processor, an embedded processor, a digital signal processor (DSP), a network processor, or other device to execute code. Although only one processor core 200 is illustrated in FIG. 13, a processing element may alternatively include more than one of the processor core 200 illustrated in FIG. 13. The processor core 200 may be a single-threaded core or, for at least one embodiment, the processor core 200 may be multithreaded in that it may include more than one hardware thread context (or "logical processor") per core.

FIG. 13 also illustrates a memory 270 coupled to the processor core 200. The memory 270 may be any of a wide variety of memories (including various layers of memory hierarchy) as are known or otherwise available to those of skill in the art. The memory 270 may include one or more code 213 instruction(s) to be executed by the processor core 200, wherein the code 213 may implement one or more aspects of the embodiments such as, for example, CiM architecture 100 (FIG. 1), CiM architecture 300 (FIG. 2), analog compute array 320 (FIG. 3A), method 450 (FIG. 4), CiM architecture 362 (FIG. 5), C-2C ladder 600 (FIG. 6), in-memory C-2C ladder multiplier 602 (FIG. 7), and/or accumulation architecture 700 (FIGS. 8 and 9), already discussed. The processor core 200 follows a program sequence of instructions indicated by the code 213. Each instruction may enter a front end portion 210 and be processed by one or more decoders 220. The decoder 220 may generate as its output a micro operation such as a fixed width micro operation in a predefined format, or may generate other instructions, microinstructions, or control signals which reflect the original code instruction. The illustrated front end portion 210 also includes register renaming logic 225 and scheduling logic 230, which generally allocate resources and queue the operation corresponding to the convert instruction for execution.

The processor core 200 is shown including execution logic 250 having a set of execution units 255-1 through 255-N. Some embodiments may include several execution units dedicated to specific functions or sets of functions. Other embodiments may include only one execution unit or one execution unit that can perform a particular function. The illustrated execution logic 250 performs the operations specified by code instructions.

After completion of execution of the operations specified by the code instructions, back-end logic 260 retires the instructions of the code 213. In one embodiment, the processor core 200 allows out of order execution but requires in order retirement of instructions. Retirement logic 265 may take a variety of forms as known to those of skill in the art (e.g., re-order buffers or the like). In this manner, the processor core 200 is transformed during execution of the code 213, at least in terms of the output generated by the decoder, the hardware registers and tables utilized by the register renaming logic 225, and any registers (not shown) modified by the execution logic 250.

Although not illustrated in FIG. 13, a processing element may include other elements on chip with the processor core 200. For example, a processing element may include memory control logic along with the processor core 200. The processing element may include I/O control logic and/or may include I/O control logic integrated with memory control logic. The processing element may also include one or more caches.

Figure 14:
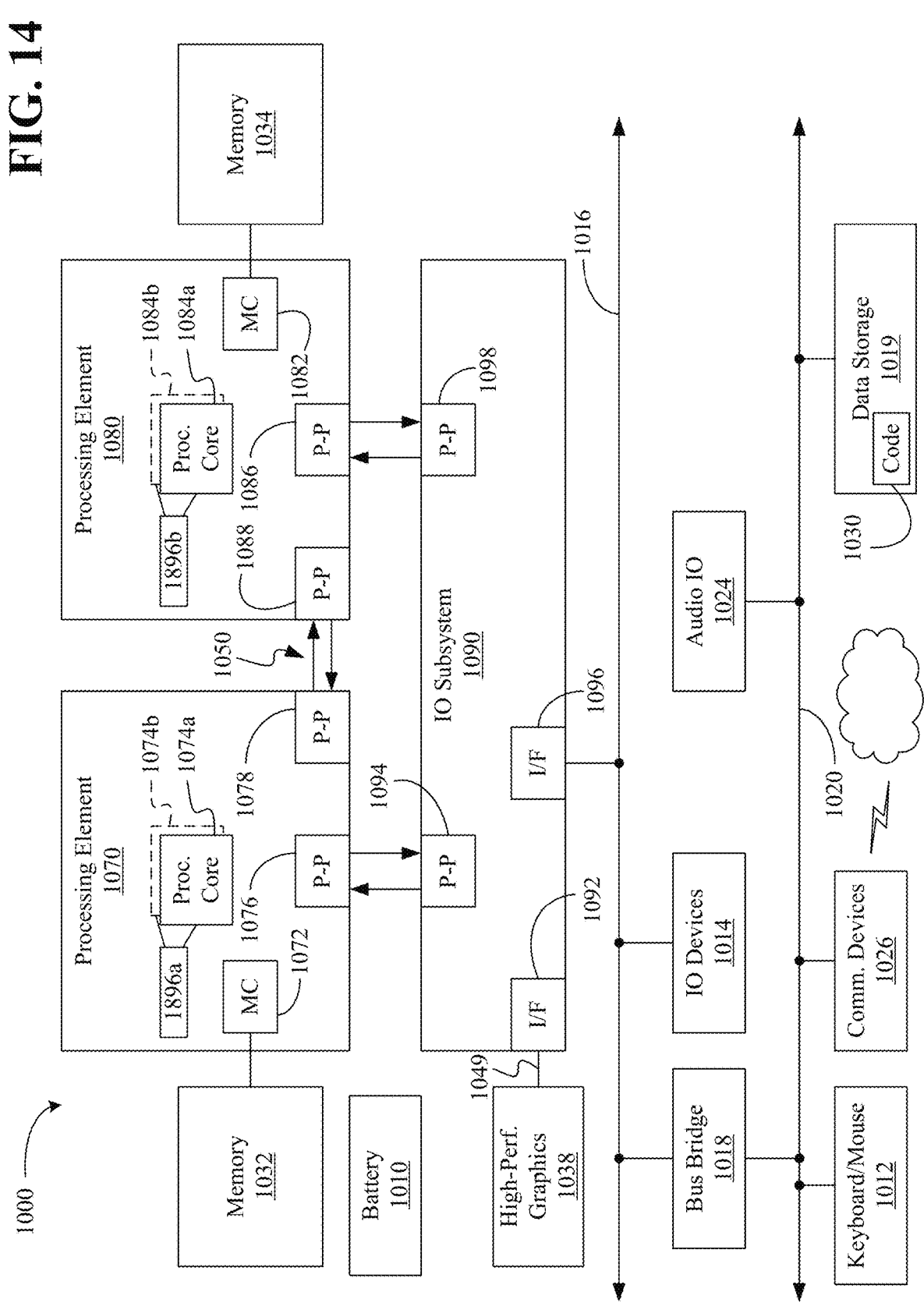
FIG. 14 is a block diagram of an example of a multi-processor based computing system according to an embodiment.

Referring now to FIG. 14, shown is a block diagram of a computing system 1000 embodiment in accordance with an embodiment. Shown in FIG. 14 is a multiprocessor system 1000 that includes a first processing element 1070 and a second processing element 1080. While two processing elements 1070 and 1080 are shown, it is to be understood that an embodiment of the system 1000 may also include only one such processing element.

The system 1000 is illustrated as a point-to-point interconnect system, wherein the first processing element 1070 and the second processing element 1080 are coupled via a point-to-point interconnect 1050. It should be understood any or all the interconnects illustrated in FIG. 14 may be implemented as a multi-drop bus rather than point-to-point interconnect.

As shown in FIG. 14, each of processing elements 1070 and 1080 may be multicore processors, including first and second processor cores (i.e., processor cores 1074a and 1074b and processor cores 1084a and 1084b). Such cores 1074a, 1074b, 1084a, 1084b may be configured to execute instruction code in a manner like that discussed above in connection with FIG. 17.

Each processing element 1070, 1080 may include at least one shared cache 1896a, 1896b. The shared cache 1896a, 1896b may store data (e.g., instructions) that are utilized by one or more components of the processor, such as the cores 1074a, 1074b and 1084a, 1084b, respectively. For example, the shared cache 1896a, 1896b may locally cache data stored in a memory 1032, 1034 for faster access by components of the processor. In one or more embodiments, the shared cache 1896a, 1896b may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the embodiments is not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to processor a first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, micro architectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

The first processing element 1070 may further include memory controller logic (MC) 1072 and point-to-point (P-P) interfaces 1076 and 1078. Similarly, the second processing element 1080 may include a MC 1082 and P-P interfaces 1086 and 1088. As shown in FIG. 14, MC's 1072 and 1082 couple the processors to respective memories, namely a memory 1032 and a memory 1034, which may be portions of main memory locally attached to the respective processors. While the MC 1072 and 1082 is illustrated as integrated into the processing elements 1070, 1080, for alternative embodiments the MC logic may be discrete logic outside the processing elements 1070, 1080 rather than integrated therein.

The first processing element 1070 and the second processing element 1080 may be coupled to an I/O subsystem 1090 via P-P interconnects 1076 1086, respectively. As shown in FIG. 14, the I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, bus 1049 may be used to couple the graphics engine 1038 to the I/O subsystem 1090. Alternately, a point-to-point interconnect may couple these components.

In turn, I/O subsystem 1090 may be coupled to a first bus 1016 via an interface 1096. In one embodiment, the first bus 1016 may be a Peripheral Component Interconnect (PCI) bus, or a bus such as a PCI Express bus or another third generation I/O interconnect bus, although the scope of the embodiments is not so limited.

As shown in FIG. 14, various I/O devices 1014 (e.g., biometric scanners, speakers, cameras, sensors) may be coupled to the first bus 1016, along with a bus bridge 1018 which may couple the first bus 1016 to a second bus 1020. In one embodiment, the second bus 1020 may be a low pin count (LPC) bus. Various devices may be coupled to the second bus 1020 including, for example, a keyboard/mouse 1012, communication device(s) 1026, and a data storage unit 1019 such as a disk drive or other mass storage device which may include code 1030, in one embodiment. The illustrated code 1030 may implement the one or more aspects of such as, for example, CiM architecture 100 (FIG. 1), CiM architecture 300 (FIG. 2), analog compute array 320 (FIG. 3A), method 450 (FIG. 4), CiM architecture 362 (FIG. 5), C-2C ladder 600 (FIG. 6), in-memory C-2C ladder multiplier 602 (FIG. 7), and/or accumulation architecture 700 (FIGS. 8 and 9), already discussed. Further, an audio I/O 1024 may be coupled to second bus 1020 and a battery 1010 may supply power to the computing system 1000.

Note that other embodiments are contemplated. For example, instead of the point-to-point architecture of FIG. 14, a system may implement a multi-drop bus or another such communication topology. Also, the elements of FIG. 14 may alternatively be partitioned using more or fewer integrated chips than shown in FIG. 14.

ADDITIONAL NOTES AND EXAMPLES

Example 1 includes a computing system comprising a plurality of memory cells, a multiply-accumulator (MAC) that includes a plurality of capacitors, where the plurality of memory cells is associated with the MAC, and a controller implemented in one or more of configurable logic or fixed-functionality logic hardware, where the controller is to identify that a first memory cell of the plurality of memory cells stores data that is associated with a multiply-accumulate operation, execute a connection operation to electrically connect the first memory cell to the MAC to execute the multiply-accumulate operation, where a second memory cell of the plurality of memory cells is electrically disconnected from the MAC during the multiply-accumulate operation, and execute, with the MAC, the multiply-accumulate operation based on the data.

Example 2 includes the computing system of Example 1, where the multiply-accumulate operation is to include a generation, with the MAC, of a first analog signal based on multibit computation operations that are executed based on the data.

Example 3 includes the computing system of any one of Examples 1 and 2, further comprising one or more of a first switch or a first transistor that is to selectively electrically connect or disconnect the first memory cell to the MAC, and one or more of a second switch or a second transistor that is to selectively electrically connect or disconnect the second memory cell from the MAC, where the connection operation includes an electrical connection of the first memory cell to the MAC with the one or more of the first switch or the first transistor, and an electrical disconnection of the second memory cell from the MAC with the one or more of the second switch or the second transistor.

Example 4 includes the computing system of any one of Examples 1 to 3, further comprising a common read bit conductor that electrically connects to the MAC and is associated with the plurality of memory cells, where the connection operation includes an electrical connection of the first memory cell to the common read bit conductor, and an electrical disconnection of the second memory cell from the common read bit conductor.

Example 5 includes the computing system of any one of Examples 1 to 4, where the data is weight data associated with a neural network operation.

Example 6 includes the computing system of anu one of Examples 1 to 5, further comprising a plurality of inverters that is to electrically isolate the plurality of memory cells from noise.

Example 7 includes the computing system of any one of Examples 1 to 6, where the plurality of memory cells is a static random-access memory, a dynamic random-access memory, a magnetoresistive random-access memory or a phase-change memory.

Example 8 includes the computing system of any one of Examples 1 to 7, where the MAC includes a C-2C ladder that includes the plurality of capacitors.

Example 9 includes a semiconductor apparatus comprising one or more substrates, and logic coupled to the one or more substrates, where the logic is implemented at least partly in one or more of configurable logic or fixed-functionality logic hardware, the logic coupled to the one or more substrates to identify that a first memory cell of a plurality of memory cells stores data that is associated with a multiply-accumulate operation, where the plurality of memory cells is associated with a multiply-accumulator (MAC), execute a connection operation to electrically connect the first memory cell to the MAC to execute the multiply-accumulate operation, where a second memory cell of the plurality of memory cells is electrically disconnected from the MAC during the multiply-accumulate operation, and execute, with the MAC, the multiply-accumulate operation based on the data.

Example 10 includes the apparatus of Example 9, where the multiply-accumulate operation is to include a generation, with the MAC, of a first analog signal based on multibit computation operations that are executed based on the data.

Example 11 includes the apparatus of any one of Examples 9 and 10, where the connection operation includes an electrical connection of the first memory cell to the MAC with one or more of a first switch or a first transistor, and an electrical disconnection of the second memory cell from the MAC with one or more of a second switch or a second transistor.

Example 12 includes the apparatus of any one of Examples 9 to 11, where the connection operation includes an electrical connection of the first memory cell to a common read bit conductor that electrically connects to the MAC, where the common read bit conductor is associated with the plurality of memory cells, and an electrical disconnection of the second memory cell from the common read bit conductor.

Example 13 includes the apparatus of any one of Examples 9 to 12, where the data is weight data associated with a neural network operation.

Example 14 includes the apparatus of any one of Examples 9 to 13, where the plurality of memory cells forms a memory array, and the memory array includes a plurality of inverters that is to electrically isolate the plurality of memory cells from noise.

Example 15 includes the apparatus of any one of Examples 9 to 14, where the plurality of memory cells is a static random-access memory, a dynamic random-access memory, a magnetoresistive random-access memory or a phase-change memory.

Example 16 includes the apparatus of any one of Examples 9 to 15, where the MAC includes a C-2C ladder that includes capacitors.

Example 17 includes the apparatus of any one of Examples 9 to 16, where the logic coupled to the one or more substrates includes transistor channel regions that are positioned within the one or more substrates.

Example 18 includes an in-memory computing system, comprising a multiply-accumulator (MAC) that includes a plurality of capacitors, a common read bit conductor that is electrically connected to the MAC, and a memory array including a plurality of memory cells and one or more of a connection switch or a connection transistor, where the one or more of the connection switch or the connection transistor is configured to selectively connect the plurality of memory cells electrically to the common read bit conductor.

Example 19 includes the in-memory computing system, of Example 18, further comprising a controller, implemented at least partly in one or more of configurable logic or fixed-functionality logic hardware, to identify that a first memory cell of the plurality of memory cells stores data that is associated with a multiply-accumulate operation, control a first transistor or a first switch of the one or more of the connection switch or the connection transistor to electrically connect the first memory cell to the MAC via the common read bit conductor, and control a second transistor or a second switch of the one or more of the connection switch or the connection transistor to electrically disconnect a second memory cell of the plurality of memory cells from the MAC during execution of the multiply-accumulate operation.

Example 20 includes the in-memory computing system of Example 19, where the MAC is configured to execute the multiply-accumulate operation.

Example 21 includes the in-memory computing system of Example 20, where the multiply-accumulate operation is to include a generation, with the MAC, of a first analog signal based on multibit computation operations that are executed based on the data.

Example 22 includes the in-memory computing system of any one of Examples 19 to 21, where the memory array includes a plurality of inverters that are to electrically isolate the plurality of memory cells from noise.

Example 23 includes the in-memory computing system of Example 22, where one of the plurality of memory cells, one of the plurality of inverters and one of the one or more of the connection switch of the connection transistor includes at least nine transistors.

Example 24 includes the in-memory computing system of any one of Examples 19 to 23, where the one or more of the connection switch or the connection transistor forms a multiplexer.

Example 25 includes the in-memory computing system of any one of Examples 19 to 24, further comprising a global word line and a global bit line that connect to the plurality of memory cells and carry signals to select a memory cell of the plurality of memory cells.

Example 26 includes a semiconductor apparatus comprising means for identifying that a first memory cell of a plurality of memory cells stores data that is associated with a multiply-accumulate operation, where the plurality of memory cells is associated with a multiply-accumulator (MAC), means for executing a connection operation to electrically connect the first memory cell to the MAC to execute the multiply-accumulate operation, where a second memory cell of the plurality of memory cells is electrically disconnected from the MAC during the multiply-accumulate operation, and means for executing, with the MAC, the multiply-accumulate operation based on the data.

Example 27 includes the apparatus of Example 26, where the multiply-accumulate operation is to include a means for generating, with the MAC, of a first analog signal based on multibit computation operations that are executed based on the data.

Example 28 includes the apparatus of any one of Examples 26 and 27, where the connection operation includes an electrical connection of the first memory cell to the MAC with one or more of a first switch or a first transistor, and an electrical disconnection of the second memory cell from the MAC with one or more of a second switch or a second transistor.

Example 29 includes the apparatus of any one of Examples 26 to 28, where the connection operation includes an electrical connection of the first memory cell to a common read bit conductor that electrically connects to the MAC, where the common read bit conductor is associated with the plurality of memory cells, and an electrical disconnection of the second memory cell from the common read bit conductor.

Example 30 includes the apparatus of any one of Examples 26 to 29, where the data is weight data associated with a neural network operation.

Example 31 includes the apparatus of any one of Examples 26 to 30, where the plurality of memory cells forms a memory array, and the memory array includes a plurality of inverters that is to electrically isolate the plurality of memory cells from noise.

Example 32 includes the apparatus of any one of Examples 26 to 31, where the plurality of memory cells is a static random-access memory, a dynamic random-access memory, a magnetoresistive random-access memory or a phase-change memory.

Example 33 includes the apparatus of any one of Examples 26 to 32, where the MAC includes a C-2C ladder that includes capacitors.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical, or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A, B, C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A computing system comprising:
a plurality of memory cells;
a charge domain multiply-accumulator that includes a plurality of capacitors; and
a controller implemented in one or more of configurable logic or fixed-functionality logic hardware, wherein the controller is to:

identify that a first memory cell of the plurality of memory cells stores data that is associated with a charge domain multiply-accumulate operation, wherein the first memory cell comprises first latches to store the data, a first switch controlled by a first control signal, and a first inverter between the first latches and the first switch;
execute a connection operation to electrically connect the first memory cell to the charge domain multiply-accumulator to execute the charge domain multiply-accumulate operation by applying the first control signal to the first switch, wherein a second memory cell of the plurality of memory cells is electrically disconnected from the charge domain multiply-accumulator during the charge domain multiply-accumulate operation; and
execute, with the charge domain multiply-accumulator, the charge domain multiply-accumulate operation based on the data.

2. The computing system of claim 1, wherein the charge domain multiply-accumulate operation is to include a generation, with the charge domain multiply-accumulator, of a first analog signal based on multibit computation operations that are executed based on the data.

3. The computing system of claim 1, wherein:
the second memory cell comprises second latches, a second switch controllable by a second control signal, and a second inverter between the second latches and the second switch; and
the controller is further to: apply the second control signal to the second switch during the charge domain multiply-accumulate operation.

4. The computing system of claim 3, further comprising a common read bit conductor that electrically connects to the charge domain multiply-accumulator and is associated with the plurality of memory cells;
wherein:
the first switch is to selectively electrically connect the first inverter to the common read bit conductor; and
the second switch is to selectively electrically connect the second inverter to the common read bit conductor.

5. The computing system of claim 3, wherein:
a side of the first latches is connected to an input of the first inverter;
the first switch selectively connects an output of the first inverter to a common read bit line according to the first control signal; and
the second switch selectively connects the second inverter to the common read bit line according to the second control signal.

6. The computing system of claim 3, wherein the first switch and the second switch form a multiplexer.

7. The computing system of claim 1, wherein the data is weight data associated with a neural network operation.

8. The computing system of claim 1, wherein the first inverter is to electrically isolate the first memory cell from noise.

9. The computing system of claim 1, wherein the plurality of memory cells is a static random-access memory, a dynamic random-access memory, a magnetoresistive random-access memory, or a phase-change memory.

10. The computing system of claim 1, wherein the charge domain multiply-accumulator includes a C-2C ladder that includes the plurality of capacitors.

11. The computing system of claim 1, wherein:
the first latches include four transistors;

the first inverter includes two transistors; and the first switch includes one transistor.

12. The computing system of claim 1, wherein:

the plurality of capacitors are Metal-Oxide-Metal capacitors placed on top of the first memory cell and the second memory cell.

13. The computing system of claim 1, wherein:

the plurality of capacitors include a plurality of branches;

each branch has a branch switch controllable by a bit and a branch capacitor; and at least one serial capacitor inserted between two branches of the plurality of branches.

14. The computing system of claim 13, wherein:

the branch capacitor has one unit capacitance; and a serial capacitor of the at least one serial capacitor has two unit capacitances.

15. The computing system of claim 1, wherein the charge domain multiply-accumulator is to receive an input activation signal of a neural network.

16. An in-memory computing system, comprising:

a charge domain multiply-accumulator that includes a plurality of capacitors;

a common read bit conductor that is electrically connected to the charge domain multiply-accumulator; and a memory array including a first memory cell and a second memory cell;

wherein:

the first memory cell comprises first latches, a first transistor, and a first inverter between the first latches and the first transistor;

the second memory cell comprises second latches, a second transistor, and a second inverter between the second latches and the second transistor;

the first transistor is to selectively connect a first output of the first inverter to the common read bit conductor; and the second transistor is to selectively connect a second output of the second inverter to the common read bit conductor.

17. The in-memory computing system of claim 16, further comprising:

a controller, implemented at least partly in one or more of configurable logic or fixed-functionality logic hardware, to:

identify that the first memory cell stores data that is associated with a charge domain multiply-accumulate operation;

control the first transistor to electrically connect the first memory cell to the charge domain multiply-accumulator via the common read bit conductor; and control the second transistor to electrically disconnect the second memory cell from the charge domain multiply-accumulator during execution of the charge domain multiply-accumulate operation.

18. The in-memory computing system of claim 17, further comprising:

a first local read word line to carry a first signal to control the first transistor; and a second local read word line to carry a second signal to control the second transistor.

19. The in-memory computing system of claim 17, wherein the charge domain multiply-accumulator is configured to execute the charge domain multiply-accumulate operation using a C-2C ladder that includes the plurality of capacitors.

20. The in-memory computing system of claim 19, wherein the charge domain multiply-accumulate operation is to include a generation, with the charge domain multiply-accumulator, of a first analog signal based on multibit computation operations that are executed based on the data.

21. The in-memory computing system of claim 16, wherein the first inverter and the second inverter are to electrically isolate the first memory cell and the second memory cell from noise on the common read bit conductor.

22. The in-memory computing system of claim 21, wherein the first memory cell includes at least nine transistors and the second memory cell includes at least nine transistors.

23. The in-memory computing system of claim 16, wherein the first transistor and the second transistor form a multiplexer.

24. A method for performing a charge domain multiply-accumulate operation:

identifying, by a controller implemented in one or more of configurable logic or fixed-functionality logic hardware, that a first memory cell of a plurality of memory cells stores data that is associated with the charge domain multiply-accumulate operation, wherein the first memory cell comprises first latches to store the data, a first switch controlled by a first control signal, and a first inverter between the first latches and the first switch;

applying, by the controller on a first local read word line, the first control signal to the first switch to electrically connect the first memory cell to a common read bit line connected to a charge domain multiply-accumulator, wherein the charge domain multiply-accumulator has a C-2C ladder;

applying, by the controller on a second local read word line, a second control signal to a second switch of a second memory cell of the plurality of memory cells to electrically disconnect the second memory cell from the common read bit line connected to the charge domain multiply-accumulator; and executing, by the charge domain multiply-accumulator, the charge domain multiply-accumulate operation based on the data.

25. The method of claim 24, wherein executing the charge domain multiply-accumulate operation based on the data comprises:

generating, with the charge domain multiply-accumulator, a first analog signal based on multibit computation operations that are executed based on the data.

* * * * *